US012221294B2

(12) United States Patent
Fujii et al.

(10) Patent No.: US 12,221,294 B2
(45) Date of Patent: Feb. 11, 2025

(54) TRANSPORT SYSTEM AND CONTROL METHOD OF TRANSPORT SYSTEM

(71) Applicant: CANON KABUSHIKI KAISHA, Tokyo (JP)

(72) Inventors: Nobuaki Fujii, Kanagawa (JP); Satoshi Nukushina, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 373 days.

(21) Appl. No.: 17/752,245

(22) Filed: May 24, 2022

(65) Prior Publication Data

US 2022/0388786 A1 Dec. 8, 2022

(30) Foreign Application Priority Data

Jun. 8, 2021 (JP) ................................. 2021-096207
Mar. 31, 2022 (JP) ................................. 2022-060217

(51) Int. Cl.
*B65G 47/90* (2006.01)
*B65G 54/02* (2006.01)
*H01L 21/677* (2006.01)
*H02K 41/025* (2006.01)

(52) U.S. Cl.
CPC ........... *B65G 47/905* (2013.01); *B65G 54/02* (2013.01); *H01L 21/67709* (2013.01); *H02K 41/025* (2013.01)

(58) Field of Classification Search
CPC . B65G 54/02; B65G 47/904; H01L 21/67709; H02K 41/025; H02K 41/02

USPC ........................................................ 198/805
See application file for complete search history.

(56) References Cited

U.S. PATENT DOCUMENTS 10,625,948 B2 4/2020 Fujii
2021/0240337 A1 8/2021 Fujii
2022/0388786 A1* 12/2022 Fujii ................... H02K 41/025

FOREIGN PATENT DOCUMENTS

| JP | 2020-28212 A | | 2/2020 | |
| KR | 20110058344 A | * | 6/2011 | ........... B65G 40/065 |
| KR | 20120058478 A | * | 6/2012 | ............. B65G 54/02 |
| KR | 20130138387 A | * | 12/2013 | ............. B65G 54/02 |
| KR | 101531656 B1 | * | 6/2015 | ............. B65G 54/02 |

* cited by examiner

*Primary Examiner* — James R Bidwell
(74) *Attorney, Agent, or Firm* — VENABLE LLP

(57) ABSTRACT

A transport system includes: a mover on which a workpiece is mounted and which is movable in a first direction; a stator that has a plurality of coils arranged in the first direction and applies force to the mover by using the plurality of coils, the force transporting the mover in the first direction while floating the mover in a second direction crossing the first direction; a control unit that acquires a position and an attitude of the mover moving in the first direction while floating in the second direction and controls the current applied to the plurality of coils to control operation of the mover based on the acquired position and attitude; and a positioning part that limits the movement of the mover, wherein the positioning part includes a first positioning part that limits the movement of the mover in a direction of external force applied to the workpiece.

16 Claims, 29 Drawing Sheets

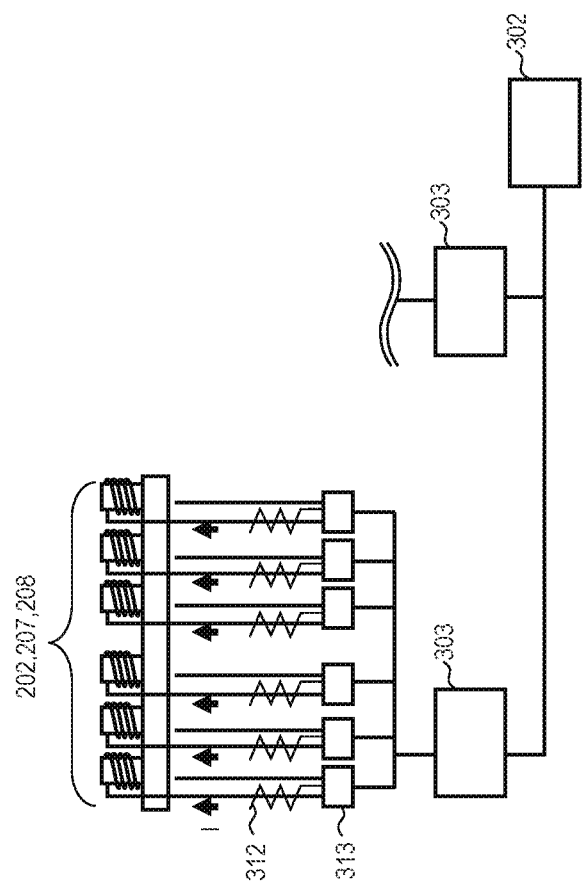

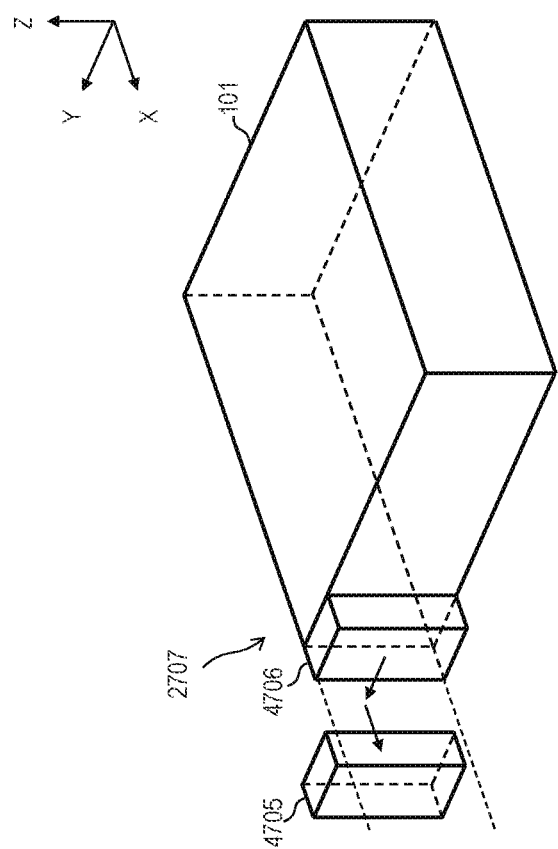

TRANSPORT SYSTEM AND CONTROL METHOD OF TRANSPORT SYSTEM

BACKGROUND OF THE INVENTION

Field of the Invention

The present invention relates to a transport system and a control system of the transport system.

Description of the Related Art

In general, a transport system is used in a production line used for assembling industry products, a semiconductor exposure apparatus, or the like. In particular, a transport system in a production line transports workpieces such as components between a plurality of stations within a factory-automated production line or between factory-automated production lines. Further, such a transport system may be used as a transport apparatus within a process apparatus. As a transport system, a transport system with a non-contact movable magnet type linear motor has already been proposed.

In the transport system with a non-contact movable magnet type linear motor, a plurality of movers transport workpieces such as component. In each process of the production line, a processing operation is performed on the workpiece. Japanese Patent Application Laid-Open No. 2020-28212 discloses a method in which a permanent magnet is arranged on the side surface of a mover to achieve good access to a workpiece, and a processing operation is performed on the workpiece on the mover by a process apparatus with a high degree of freedom.

In order to realize stable processing in each process of the production line, it is necessary that the mover transporting the workpiece maintains a stable position against external force during the processing, and the workpiece is accurately positioned.

In this regard, the method disclosed in Japanese Patent Application Laid-Open No. 2020-28212 maintains the mover in a stable position by receiving an external force applied to the mover from the process with control rigidity. That is, the method disclosed in Japanese Patent Application Laid-Open No. 2020-28212 maintains a stable position of the mover by controlling the current flowing through the coil for applying a force to the mover.

On the other hand, since there is an upper limit to the current that can be applied to the coil, there is an upper limit to the force required to maintain the mover in a stable position. Therefore, the external force applied to the mover from the process must be smaller than the upper limit of the force for maintaining the stable position of the mover.

Therefore, the mover may not be able to maintain a stable position against a large external force during processing. In order to accurately position the workpiece, it is necessary to maintain a stable position of the mover regardless of the magnitude of the external force applied to the mover during processing of the workpiece.

SUMMARY OF THE INVENTION

It is an object of the present invention to provide a floating type transport system and a control method of the transport system capable of stabilizing the position of a mover regardless of the magnitude of an external force applied to the mover during processing of a workpiece.

According to one aspect of the present invention, there is provided a transport system including: a mover on which a workpiece is mounted and which is movable in a first direction; a stator that has a plurality of coils arranged in the first direction and applies force to the mover by using the plurality of coils to which current is applied, the force transporting the mover in the first direction while floating the mover in a second direction crossing the first direction; a control unit that acquires a position and an attitude of the mover moving in the first direction while floating in the second direction and controls the current applied to the plurality of coils to control operation of the mover based on the acquired position and the acquired attitude; and a positioning part that limits the movement of the mover, wherein the positioning part includes a first positioning part that limits the movement of the mover in a direction of external force applied to the workpiece.

According to another aspect of the present invention, there is provided a control method of a transport system, the transport system including: a mover on which a workpiece is mounted and which is movable in a first direction; a stator that has a plurality of coils arranged in the first direction and applies force to the mover by using the plurality of coils to which current is applied, the force transporting the mover in the first direction while floating the mover in a second direction crossing the first direction; and a positioning part that limits the movement of the mover, wherein the positioning part includes a first positioning part that limits the movement of the mover in a direction of external force applied to the mover during the processing of the workpiece, the control method comprising: acquiring a position and an attitude of the mover moving in the first direction while floating in the second direction and controlling the current applied to the plurality of coils to control operation of the mover based on the acquired position and the acquired attitude; and landing the mover in the direction of the external force and performing pressing control to press the mover so that the movement of the mover is limited by the first positioning part.

Further features of the present invention will become apparent from the following description of exemplary embodiments with reference to the attached drawings.

BRIEF DESCRIPTION OF THE DRAWINGS

FIG. 3 is a schematic diagram illustrating coils and a configuration related to the coils in the transport system according to the first embodiment of the present invention.

FIG. 21B is a schematic diagram illustrating another configuration of the transport system according to the third embodiment of the present invention.

DESCRIPTION OF THE EMBODIMENTS

First Embodiment

A first embodiment of the present invention will be described below with reference to FIG. 1 to FIG. 16.

Figure 1:
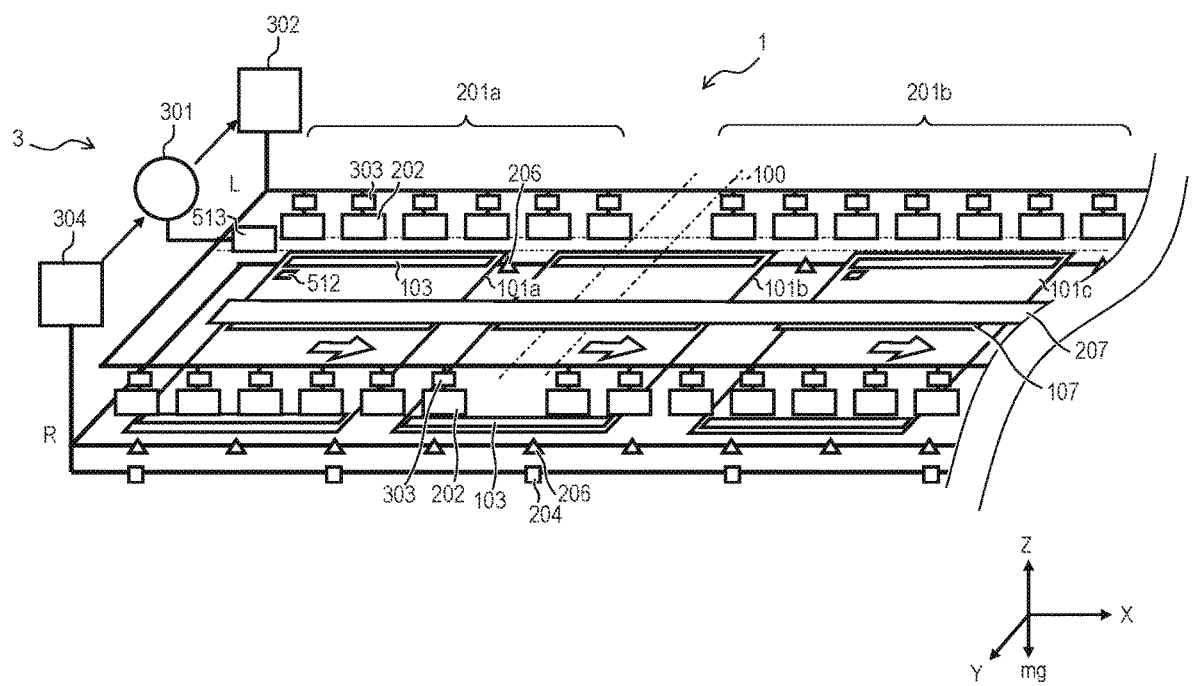
FIG. 1 is a schematic diagram illustrating a configuration of a transport system according to a first embodiment of the present invention.
Figure 2A:
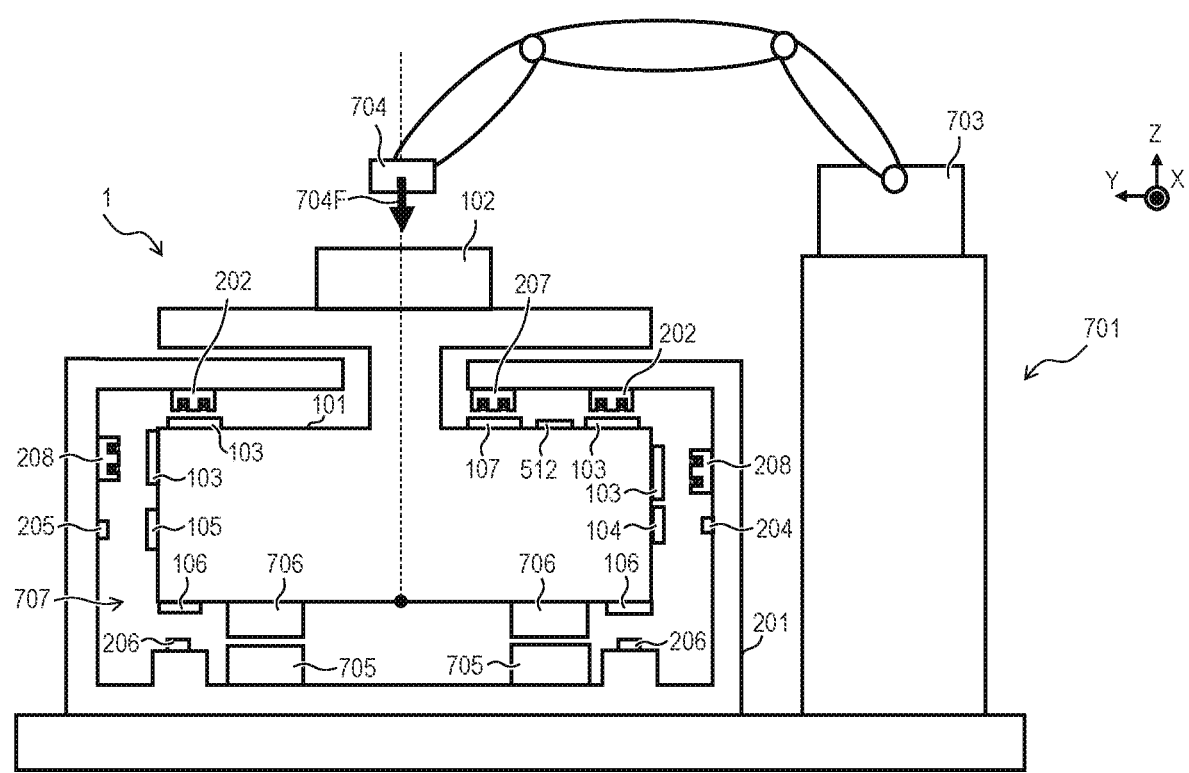
FIG. 2A is a schematic diagram illustrating the configuration of the transport system according to the first embodiment of the present invention.
Figure 2B:
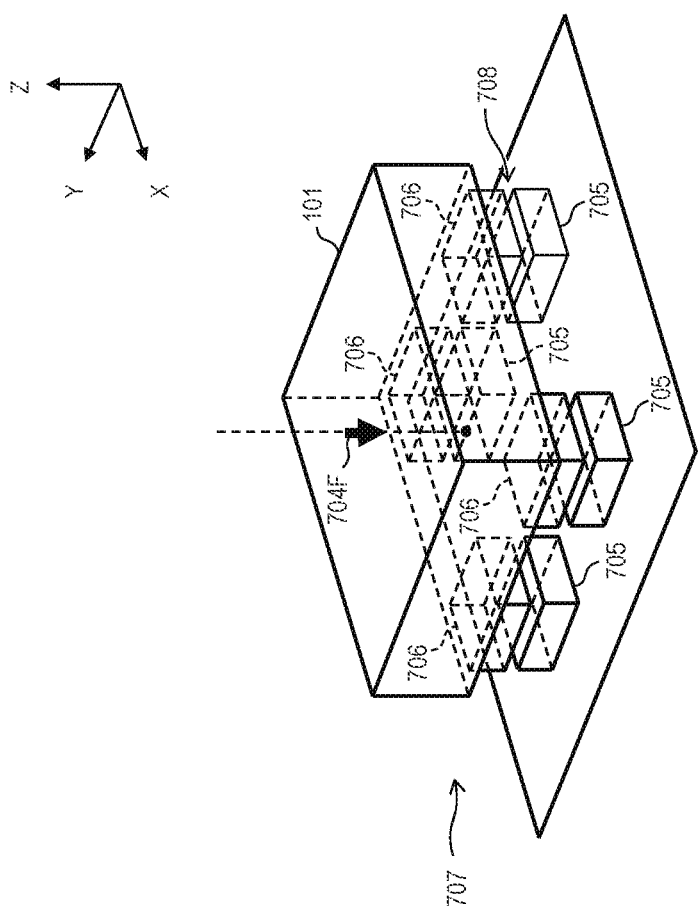
FIG. 2B is a schematic diagram illustrating the configuration of the transport system according to the first embodiment of the present invention.

First, a configuration of a transport system 1 according to the present embodiment will be described with reference to FIG. 1 to FIG. 3. FIG. 1 and FIG. 2B are schematic diagrams illustrating the configuration of the transport system 1 including movers 101 and stators 201 according to the present embodiment. Note that FIG. 1 and FIG. 2A are views of extracted main portions of each mover 101 and each stator 201, respectively. Further, FIG. 2B illustrates the mover 101, Z-axis positioning parts 705 on the side of the stator 201 and Z-axis positioning parts 706 on the side of the mover 101. FIG. 1 and FIG. 2B are views of the mover 101 viewed from obliquely above, and FIG. 2A is a view of the mover 101 and the stator 201 viewed from the X direction. FIG. 3 is a schematic diagram illustrating coils 202, 207, and 208 and a configuration related to the coils 202, 207, and 208 in the transport system 1.

As illustrated in FIG. 1 and FIG. 2B, the transport system 1 according to the present embodiment includes the mover 101 forming a carrier, a carriage or a slider, and the stator 201 forming a transport path.

Further, the transport system 1 has an integration controller 301, a coil controller 302, a coil unit controller 303, and a sensor controller 304. Note that FIG. 1 illustrates a case where three movers 101a, 101b, and 101c are shown as the mover 101 and two stators 201a and 201b as the stator 201. In the following description, a reference including only the numeral common to others is used when it is not particularly required to distinguish components that may be present as multiple components, such as the mover 101 and the stator 201, and a lowercase alphabet is appended to a numeral reference to distinguish the individuals if necessary. Further, when a component of the mover 101 on the R side and a component on the L side of the mover 101 are distinguished from each other, "R" indicating the R side or "L" indicating the L side is appended to the lowercase alphabet.

The transport system 1 according to the present embodiment is a transport system with an inductive type linear motor that generates electromagnetic force between the coil 207 of the stator 201 and a conductive plate 107 of the mover 101 and applies the thrust in the X direction to the mover 101. Further, the transport system 1 according to the present embodiment is a magnetic floating type transport system that causes the mover 101 to float and transports the mover 101 in a contactless manner. The transport system 1 according to the present embodiment forms a part of a processing system having a process apparatus that performs processing on a workpiece 102 transported by the mover 101.

The transport system 1 transports the workpiece 102 held by the mover 101 to a process apparatus that performs processing operation on the workpiece 102 by transporting the mover 101 by the stator 201, for example. The process apparatus is not particularly limited, and may be, for example, an assembling apparatus 701 that assembles a part, component or the like to the workpiece 102. In FIG. 1, the three movers 101 are shown with respect to the two stators 201, but the embodiment is not limited thereto. In the transport system 1, one or a plurality of movers 101 can be transported on one or a plurality of stators 201.

Herein, coordinate axes, directions, and the like used in the following description are defined. First, the X-axis is taken along the horizontal direction that is the transport direction of the mover 101, and the transport direction of the mover 101 is defined as the X direction. Within the X direction, the direction in which the mover 101 advances is defined as a +X direction and the direction opposite to the +X direction is defined as a −X direction. Further, a Z-axis is taken along the perpendicular direction that is a direction orthogonal to the X direction, and the perpendicular direction is defined as a Z direction. The perpendicular direction corresponds to a direction of the gravity (mg direction). Within the Z direction, the mg direction in which gravity works from top to bottom is defined as −Z direction and the direction opposite to the −Z direction is defined as a +Z direction. Further, a Y-axis is taken is taken along a direction orthogonal to the X direction and the Z direction, and the direction orthogonal to the X direction and the Z direction is defined as a Y direction. Within the Y direction, the direction from left to right with respect to the +X direction is defined as +Y direction and the direction opposite to the +Y direction is defined as a −Y direction. Furthermore, a rotation direction around the X-axis is defined as a Wx direction, a rotation direction around the Y-axis is defined as a Wy direction, and a rotation direction around the Z-axis is defined as a Wz direction. Further, "*" is used as a multiplication symbol. Further, the center of the mover 101 is defined as origin Oc, the +Y side is denoted as R side, and the −Y side is denoted as L side. Note that, although the transport direction of the mover 101 is not necessarily required to be a horizontal direction, the Y direction and the Z direction can be similarly defined also in such a case with the transport direction being defined as the X direction. Note that the X direction, the Y direction, and the Z direction are not necessarily limited to directions orthogonal to each other and can be defined as directions crossing each other. Further, a displacement in the transport direction is defined as a position, a displacement in other directions is defined as an attitude, and the position and the attitude together are defined as a state.

Further, symbols used in the following description are as follows. Note that each symbol is used for respective cases of the coils 202, 207, and 208 in a duplicated manner.

Oc: the origin of the mover 101
Os: the origin of the linear scale 104
Oe: the origin of stator 201
j: index for identifying a coil
(Note that j is an integer satisfying 1≤j≤N, where N is an integer greater than or equal to two.)
N: the number of installed coils
Ij: current amount applied to the j-th coil
P: state including the position and the attitude of the mover 101 (X, Y, Z, Wx, Wy, Wz)
X (j, P): X-coordinate of the j-th coil when viewed from the center of the mover 101 in a state P
Y (j, P): Y-coordinate of the j-th coil when viewed from the center of the mover 101 in a state P
Z (j, P): Z-coordinate of the j-th coil when viewed from the center of the mover 101 in a state P
T: force applied to the mover 101
Tx: force component in the X direction of force T
Ty: force component in the Y direction of force T
Tz: force component in the Z direction of force T
Twx: torque component in the Wx direction of force T
Twy: torque component in the Wy direction of force T
Twz: torque component in the Wz direction of force T
Ex (j, P): force in the X direction working on the mover 101 in the state P when unit current is applied to the j-th coil
Ey (j, P): force in the Y direction working on the mover 101 in the state P when unit current is applied to the j-th coil
Ez (j, P): force in the Z direction working on the mover 101 in the state P when unit current is applied to the j-th coil
Σ: sum when the index j is changed from 1 to N
*: product of matrixes, vectors, or matrix and vector
M: torque contribution matrix
K: pseudo-current vector (column vector)
Tq: torque vector (column vector)
Is: coil current vector (column vector)
Fs: coil force vector (column vector)
M (a, b): element on the a-th row and on the b-th column of the matrix M
Inv ( ): inverse matrix
Tr ( ): transpose matrix
Tr (element 1, element 2, . . . ): column vector whose elements are element 1, element 2, . . . .

As indicated by arrows in FIG. 1, the mover 101 is configured to be movable in the X direction that is the transport direction. The mover 101 has yoke plates 103 and the conductive plate 107. Further, the mover 101 has a linear scale 104, a Y-target 105, and Z-targets 106. The mover 101 has Z-axis positioning parts 706. Further, each mover 101 has an RFID (Radio Frequency Identification) tag 512, which is an information medium in which identification information for identifying each mover 101 is registered.

A plurality of yoke plates 103 are attached and installed on a plurality of portions of the mover 101. Specifically, the yoke plates 103 are attached and installed along the X direction at respective ends on the R side and the L side on the top face of the mover 101. Further, the yoke plates 103 are attached and installed along the X direction at respective side faces on the R side and the L side of the mover 101. Each yoke plate 103 is an iron plate made of a substance having a large magnetic permeability, for example, iron.

The conductive plate 107 is attached and installed along the X direction at the center part on the top face of the mover 101. The conductive plate 107 is not particularly limited as long as it has conductivity, such as a conductive metal plate, and an aluminum plate or the like having a small electric resistance is preferable.

Note that the installation places of yoke plates 103 and conductive plates 107 and the number thereof are not limited to the example described above and may be changed as appropriate.

The linear scale 104, the Y-target 105, and the Z-target 106 are attached and installed in the mover 101 at positions that can be read by the linear encoder 204, the Y-sensor 205, and the Z-sensor 206 installed on the stator 201, respectively.

The RFID tag 512 is attached and installed in the mover 101 at a position that can be read by an RFID reader 513. The RFID reader 513 is installed at a specific position on the transport path of the mover 101 in the transport system 1. An individual ID (Identification), which is identification information, is registered in the RFID tag 512 so as to identify the mover 101 to which the RFID tag 512 is attached. Note that the mover 101 may be provided with an information medium such as a QR code (registered trademark) indicating an individual ID of the mover 101 in place of the RFID tag 512. In this case, in place of the RFID reader 513, a reader such as a scanner that reads the individual ID from the information medium in accordance with the information medium can be used.

The mover 101 is configured to be transported by attaching or holding a workpiece 102 on or under the mover 101, for example. FIG. 2A, illustrates a state in which the workpiece 102 is attached on the mover 101 to be mounted on the mover 101. Note that the mechanism for attaching or holding the workpiece 102 on or under the mover 101 is not particularly limited, but a general attachment mechanism, a holding mechanism, or the like such as a mechanical hook, an electrostatic chuck, or the like, can be used.

The stator 201 has the coils 202, 207, and 208, the linear encoder 204, the Y-sensor 205, and the Z-sensors 206. Further, the stator 201 has Z-axis positioning parts 705.

In FIG. 2A, a plurality of coils 202 are attached and installed along the X direction on the stator 201 so as to be able to face, along the Z direction, the yoke plate 103 installed on the top face of the mover 101. Specifically, the plurality of coils 202 are arranged and installed in two lines parallel to the X direction so as to be able to face, from the top in the Z direction, the two yoke plates 103 installed at respective ends on the R side and the L side on the top face of the mover 101.

A plurality of coils 208 are attached and installed along the X direction to the stator 201 so as to be able to face, along the Y direction, the yoke plate 103 installed on the side face of the mover 101. Specifically, the plurality of coils 208 are arranged and installed in two lines parallel to the X direction so as to be able to face, from the side in the Y direction, the two yoke plates 103 installed on respective side faces on the R side and the L side of the mover 101.

A plurality of coils 207 are attached and installed along the X direction on the stator 201 so as to be able to face, along the Z direction, the conductive plate 107 installed on the top face of the mover 101. Specifically, the plurality of coils 207 are arranged and installed in a single line parallel to the X direction so as to be able to face, from the top in the Z direction, the conductive plates 107 installed at the center part on the top face of the mover 101.

The stator 201 applies force to the mover 101 that is movable in the transport direction by respective coils 202, 207, and 208 to which current is applied. Thereby, the mover 101 is transported in the transport direction while the position and the attitude thereof are controlled.

Note that the installation places of the coils 202, 207, and 208 are not limited to the examples described above and may be changed as appropriate. Further, the number of installed coils 202, 207, and 208 may be changed as appropriate.

The linear encoder 204, the Y-sensor 205, and the Z-sensor 206 function as a detection unit that detects the position and the attitude of the mover 101 that moves in the transport direction.

The linear encoder 204 is attached and installed on the stator 201 so as to be able to read the linear scale 104 installed on the mover 101. The linear encoder 204 detects the relative position between the linear encoder 204 and the mover 101 by reading the linear scale 104.

The Y-sensor 205 is attached and installed on the stator 201 so as to be able to detect the distance in the Y direction to the Y-target 105 installed on the mover 101. The Z-sensor 206 is attached and installed on the stator 201 so as to be able to detect the distance in the Z direction to the Z-target 106 installed on the mover 101.

FIG. 1 also illustrates an area between the stator 201a and the stator 201b, including, for example, a place where a structure 100 connecting the process and the process is located. The place of the structure 100 is such that it is not possible to place electromagnets or coils continuously between multiple stations within the production line or between the production lines.

The transport system 1 includes the Z-axis positioning part 705 on the side of the stator 201 and the Z-axis positioning part 706 on the side of the mover 101 as positioning parts for positioning the mover 101 in the Z direction. The Z-axis positioning parts 705 and 706 are members that restricts the movement of the mover 101 in the Z direction, which is the direction of an external force 704F to be applied to the workpiece 102 and the mover 101, which will be described later, when the workpiece 102 is processed.

That is, the stator 201 has a plurality of Z-axis positioning parts 705. The Z-axis positioning part 705 has surface accuracy of a surface facing the Z direction, and can be used as a positioning reference in the Z direction. The mover 101 has a plurality of Z-axis positioning parts 706 corresponding to the plurality of Z-axis positioning parts 705. The Z-axis positioning part 706 has surface accuracy of a surface facing the Z direction, and can be used as a positioning reference in the Z direction.

In the stator 201, a plurality of Z-axis positioning parts 705 are installed on a floor surface of an area where the mover 101 lands. The area where the mover 101 lands is a work area 707 where the assembling apparatus 701 assembles a component 704 to the workpiece 102 on the mover 101.

Each of the plurality of Z-axis positioning parts 705 is a columnar member having an upper surface parallel to the XY plane facing the +Z direction. The upper surfaces of the plurality of Z-axis positioning parts 705 have the same positions in the Z direction. The plurality of Z-axis positioning parts 705 are provided on the floor surface which is the bottom surface of the stator 201. The material of the plurality of Z-axis positioning parts 705 may be the same as that of the stator 201. In this case, the plurality of Z-axis positioning parts 705 are formed integrally with the stator 201. Elastic bodies or body such as rubber (not shown) may be provided between the plurality of Z-axis positioning parts 705 and the floor surface of the stator 201.

In the mover 101, the plurality of Z-axis positioning parts 706 are installed on the lower surface facing the floor surface where the Z-axis positioning parts 705 of the stator 201 are installed. Each of the plurality of Z-axis positioning parts 706 is a columnar member having a lower surface parallel to the XY plane facing the −Z direction. The lower surfaces of the plurality of Z-axis positioning parts 706 have the same positions in the Z direction. The plurality of Z-axis positioning parts 706 are arranged at positions that can face the corresponding Z-axis positioning parts 705.

As described later, the mover 101 floated in the +Z direction and transported in the X direction lands in the Z direction so that the lower surface of each Z-axis positioning part 706 contacts the upper surface of the corresponding Z-axis positioning part 705 in the work area 707. The landing mover 101 can be floated again to be transported.

In order for the mover 101 to float again after landing in the Z direction, the mover 101 must be able to move in the +Z direction. Therefore, the Z-axis positioning part 705 on the side of the stator 201 and the Z-axis positioning part 706 on the side of the mover 101 are provided within a range where the mover 101 can move in the +Z direction. That is, the Z-axis positioning parts 705 and 706 are provided inside the movable range in the Z direction of the mover 101.

That is, when the mover 101 lands in the Z direction, the mover 101 cannot move in the +Z direction unless the floating force in the +Z direction, which the coil 202 can generate, is larger than the gravity in the −Z direction working on the mover 101. The maximum floating force in the +Z direction which the coil 202 can generate is determined by the spacing between the coil 202 and the yoke plate 103. When the interval between the coil 202 and the yoke plate 103 is large, the maximum floating force becomes small. Therefore, the Z-axis positioning part 705 on the side of the stator 201 and the Z-axis positioning part 706 on the side of the mover 101 are provided so that the distance between the Z-axis positioning part 705 and the Z-axis positioning part 706 is within a range in which the mover 101 can move in the +Z direction.

The mover 101 and the stator 201 are provided with a process apparatus that performs a processing operation on the workpiece 102 transported by the mover 101. FIG. 2A illustrates a case where the mover 101 and the stator 201 are incorporated in the assembling apparatus 701, which is an example of a process apparatus for performing a processing operation on the workpiece 102.

The assembling apparatus 701 has an assembling robot 703 that performs assembling operation to the workpiece 102 attached to a mover 101. In the assembling operation, the component 704 is assembled to the workpiece 102. The assembling robot 703 is installed in the assembling apparatus 701 so as to be capable of executing the assembling operation with respect to the workpiece 102 attached to the upper part of the mover 101. The assembling robot 703 assembles the component 704 from the Z direction to the workpiece 102 attached on the upper part of the mover 101 transported to the work area 707 in front of the installation place of the assembling robot 703.

A control system 3 that controls the transport system 1 is provided to the transport system 1. Note that the control system 3 may form a part of the transport system 1. The control system 3 has the integration controller 301, the coil controllers 302, the coil unit controllers 303, and the sensor controller 304. The coil controllers 302 and the sensor controller 304 are connected to the integration controller 301 in a communicable manner. The plurality of coil unit controllers 303 are connected to the coil controller 302 in a communicable manner. The plurality of linear encoders 204, the plurality of Y-sensors 205, and the plurality of Z-sensors 206 are connected to the sensor controller 304 in a communicable manner. The coils 202, 207, and 208 are connected to each coil unit controller 303 (see FIG. 3).

The integration controller 301 determines current instruction values to be applied to the plurality of coils 202, 207, and 208 based on the output from the linear encoder 204, the Y-sensor 205, and the Z-sensor 206 transmitted from the sensor controller 304. The integration controller 301 transmits the determined current instruction values to the coil controllers 302. The coil controller 302 transmits the current instruction values received from the integration controller 301 to respective coil unit controllers 303. The coil unit controller 303 controls the current amounts of the connected coils 202, 207, and 208 based on the current instruction values received from the coil controller 302.

Further, the RFID reader 513 is communicatively connected to the integration controller 301. The RFID reader 513 acquires the individual ID of the mover 101 by reading the RFID tag 512 of the mover 101. The RFID reader 513 transmits the acquired individual ID to the integration controller 301. The integration controller 301 can receive to recognize the individual ID of the mover 101 transmitted from the RFID reader 513 and identify the mover 101. The RFID reader 513 is installed at one or a plurality of positions in the transport path constituted by the stator 201.

As illustrated in FIG. 3, one or a plurality of coils 202, 207, and 208 are connected to each coil unit controller 303. A current sensor 312 and a current controller 313 are connected to each of the coils 202, 207, and 208. The current sensor 312 detects the current value flowing in the connected coils 202, 207, and 208. The current controller 313 controls the current amount flowing in the connected coils 202, 207, and 208.

The coil unit controller 303 instructs the current controller 313 for a desired current amount based on the current instruction value received from the coil controller 302. The current controller 313 detects the current value detected by the current sensor 312 and controls the current amount so that current of a desired current amount flows in individual coils 202, 207, and 208.

Figure 4:
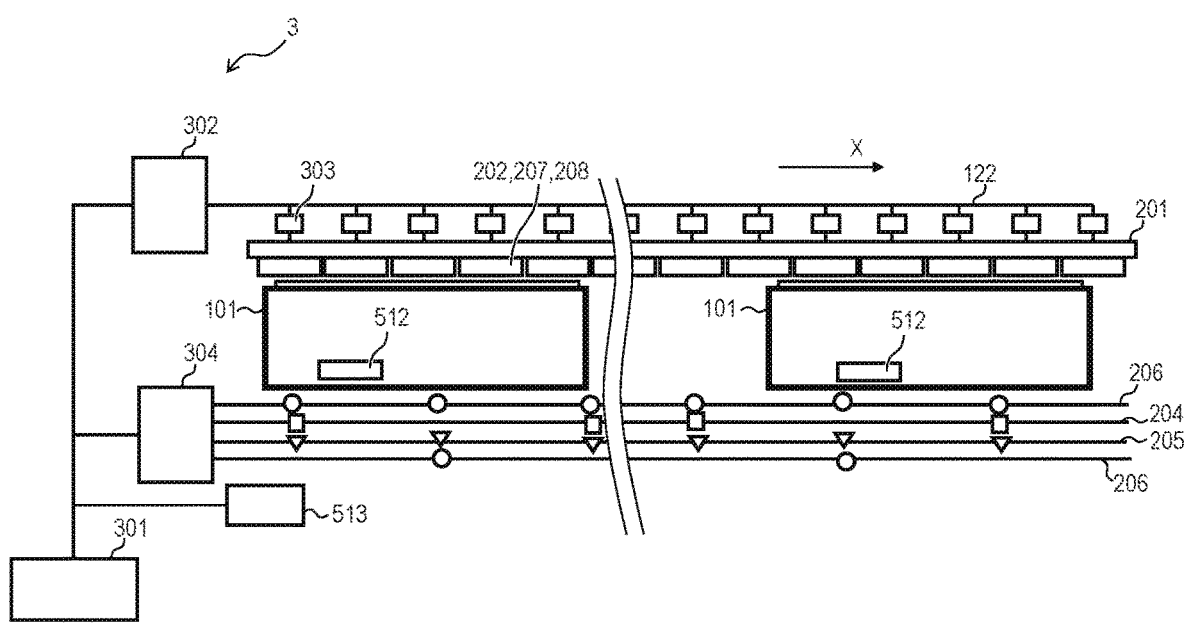
FIG. 4 is a schematic diagram illustrating a control system that controls the transport system according to the first embodiment of the present invention.

Next, the control system 3 that controls the transport system 1 according to the present embodiment will be further described with reference to FIG. 4. FIG. 4 is a schematic diagram illustrating the control system 3 that controls the transport system 1 according to the present embodiment.

As illustrated in FIG. 4, the control system 3 has the integration controller 301, the coil controller 302, the coil unit controllers 303, and the sensor controller 304. The control system 3 functions as a control unit that controls the transport system 1 including the mover 101 and the stator 201. The coil controller 302, the sensor controller 304, and the RFID reader 513 are connected to the integration controller 301 in a communicable manner.

The plurality of coil unit controllers 303 are connected to the coil controller 302 in a communicable manner. The coil controller 302 and the plurality of coil unit controllers 303 connected thereto are provided in association with respective columns of the coils 202, 207, and 208. The coils 202, 207, and 208 are connected to each coil unit controller 303. The coil unit controller 303 can control the level of the current of the connected coils 202, 207, and 208.

The coil controller 302 instructs target current values to each of the connected coil unit controllers 303. The coil unit controller 303 controls the current amount of the connected coils 202, 207, and 208.

The plurality of linear encoders 204, the plurality of Y-sensors 205, and the plurality of Z-sensors 206 are connected to the sensor controller 304 in a communicable manner.

The plurality of linear encoders 204 are attached to the stator 201 at intervals such that one of the linear encoders 204 can always measure the position of one mover 101 even during transportation of the mover 101. Further, the plurality of Y-sensors 205 are attached to the stator 201 at intervals such that two of the Y-sensors 205 can always measure the Y-target 105 of one mover 101. Further, the plurality of Z-sensors 206 are attached to the stator 201 at intervals such that three of the two lines of Z-sensors 206 can always measure the Z-target 106 of one mover 101 and so as to form a plane.

The integration controller 301 determines current instruction values to be applied to the plurality of coils 202 based on the output from the linear encoders 204, the Y-sensors 205, and the Z-sensors 206 and transmits the current instruction values to the coil controllers 302. The coil controller 302 instructs the coil unit controllers 303 for the current values based on the current instruction values from the integration controller 301 as described above. Accordingly, the integration controller 301 functions as a control unit to transport the mover 101 in a contactless manner along the stator 201 and control the attitude of the transported mover 101 in six axes.

The integration controller 301 can identify the mover 101 by the individual ID the integration controller 301 has received from the RFID reader 513 which read the RFID tag 512 attached to mover 101. This allows the integration controller 301 to apply individual parameters to each mover 101 to control the operation of the mover 101.

Figure 5:
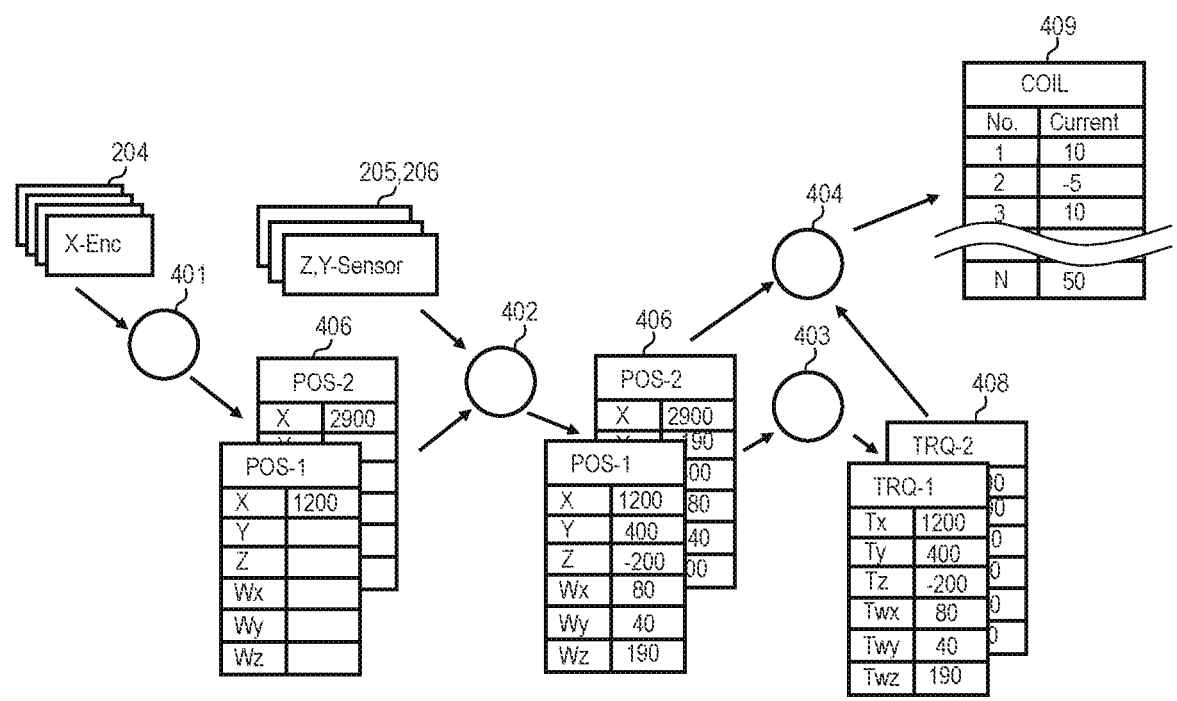
FIG. 5 is a schematic diagram illustrating an attitude control method of a mover in the transport system according to the first embodiment of the present invention.

Next, the attitude control method of the mover 101 performed by the integration controller 301 will be described below with reference to FIG. 5. FIG. 5 is a schematic diagram illustrating the attitude control method of the mover 101 in the transport system 1 according to the present embodiment. FIG. 5 illustrates the overview of the attitude control method of the mover 101 by mainly focusing on the data flow. The integration controller 301 performs a process using a mover position calculation function 401, a mover attitude calculation function 402, a mover attitude control function 403, and a coil current calculation function 404 as described below. Accordingly, the integration controller 301 controls transportation of the mover 101 while controlling the attitude of the mover 101 in six axes. Note that, instead of the integration controller 301, the coil controller 302 can perform the same process as the integration controller 301.

First, the mover position calculation function 401 is used to calculate the number and the positions of the movers 101 on the stator 201, which forms a transport path, in accordance with the measured values from the plurality of linear encoders 204 and information on the attachment position thereof.

With the above calculation, the mover position calculation function 401 updates mover position information (X) and number information in mover information 406 that is information on the mover 101. The mover position information (X) illustrates the position in the X direction that is the transport direction of the mover 101 on the stator 201. The mover information 406 is prepared for each mover 101 on the stator 201 as indicated as POS-1, POS-2, . . . in FIG. 5, for example.

Next, the mover attitude calculation function 402 is used to determine the Y-sensor 205 and the Z-sensor 206 that can measure respective movers 101 from the mover position information (X) in the mover information 406 updated by the mover position calculation function 401.

Next, the mover attitude calculation function 402 calculates attitude information (Y, Z, Wx, Wy, Wz) that is information on the attitude of each mover 101 and updates the mover information 406. The mover attitude calculation function 402 calculates the attitude information (Y, Z, Wx, Wy, Wz) based on the values output from the determined Y-sensor 205 and the determined Z-sensor 206. The mover information 406 updated by the mover attitude calculation function 402 includes the mover position information (X) and the attitude information (Y, Z, Wx, Wy, Wz).

Next, the mover attitude control function 403 is used to calculate application force information 408 for each mover 101 from the current mover information 406 including the mover position information (X) and the attitude information (Y, Z, Wx, Wy, Wz) and an attitude target value. The application force information 408 is information related to the magnitude of force to be applied to each mover 101. The application force information 408 includes information related to three-axis components of force T (Tx, Ty, Tz) and three-axis components of torque (Twx, Twy, Twz) to be applied. The application force information 408 is prepared for each mover 101 on the stator 201 as indicated as TRQ-1, TRQ-2, . . . in FIG. 5, for example.

Herein, Tx, Ty, and Tz, which are three-axis components of force, are an X direction component, a Y direction component, and a Z direction component of force, respectively. Further, Twx, Twy, and Twz, which are three-axis components of torque, are a component around the X-axis, a component around the Y-axis, and a component around the Z-axis of torque, respectively. The transport system 1 according to the present embodiment controls transportation of the mover 101 while controlling the attitude of the mover 101 in six axes by controlling these six-axis components (Tx, Ty, Tz, Twx, Twy, Twz) of force T.

Next, the coil current calculation function 404 is used to determine a current instruction value 409 applied to respective coils 202, 207, and 208 based on the application force information 408 and the mover information 406.

In such a way, the integration controller 301 determines the current instruction value 409 by performing a process using the mover position calculation function 401, the mover attitude calculation function 402, the mover attitude control function 403, and the coil current calculation function 404. The integration controller 301 transmits the determined current instruction value 409 to the coil controller 302.

Figure 6:
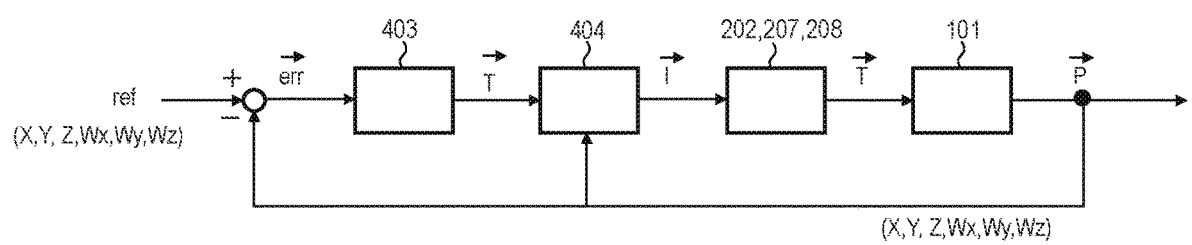
FIG. 6 is a schematic diagram illustrating an example of a control block used for controlling the position and attitude of the mover in the transport system according to the first embodiment of the present invention.

Control of the position and the attitude of the mover 101 will be further described in detail with reference to FIG. 6. FIG. 6 is a schematic diagram illustrating an example of a control block used for controlling the position and the attitude of the mover 101.

In FIG. 6, the symbol P denotes the position and the attitude (also referred to as a position and attitude or a state) of the mover 101 and has components (X, Y, Z, Wx, Wy, Wz). The symbol ref denotes a target value of (X, Y, Z, Wx, Wy, Wz). The symbol err denotes a deviation between the target value ref and the position and the attitude P.

The mover attitude control function 403 is used to calculate force T to be applied to the mover 101 for achieving the target value ref based on the level of the deviation err, the change in the deviation err, an accumulation value of the deviation err, or the like.

The coil current calculation function 404 is used to calculate coil current I to be applied to the coils 202, 207, and 208 for applying the force T to the mover 101 based on the force T to be applied and the position and the attitude P. The coil current I calculated in such a way is applied to the coils 202, 207, and 208, and thereby the force T works on the mover 101, and the position and the attitude P changes to the target value ref.

By configuring the control block in such a way, it is possible to control the position and the attitude P of the mover 101 to a desired target value ref.

Figure 7A:
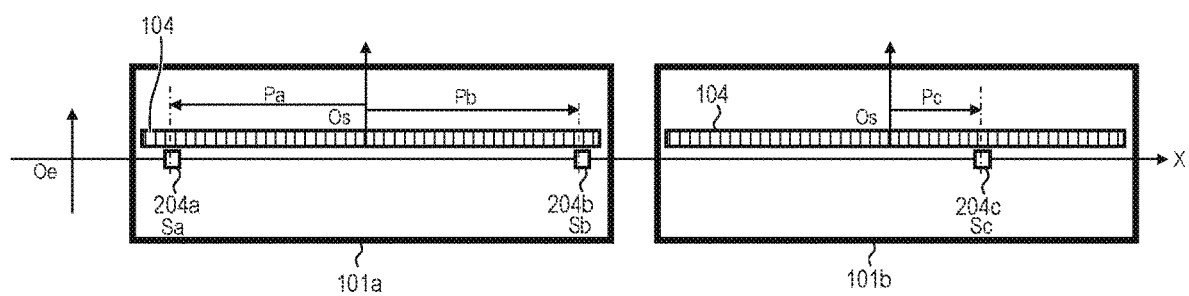
FIG. 7A is a schematic diagram illustrating a process using a mover position calculation function in the transport system according to the first embodiment of the present invention.
Figure 7B:
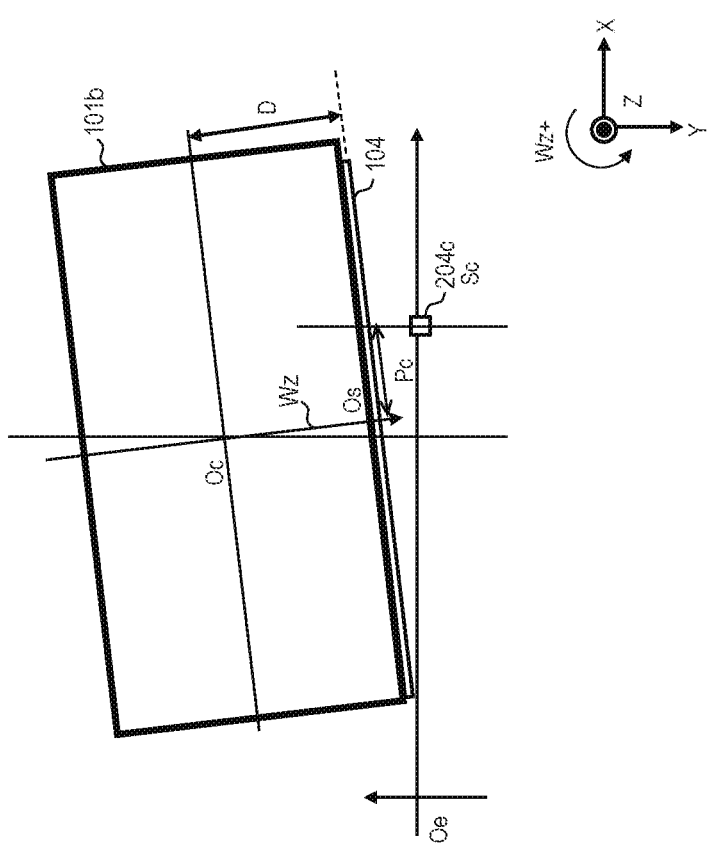
FIG. 7B is a schematic diagram illustrating a process using a mover position calculation function in the transport system according to the first embodiment of the present invention.

The process in accordance with the mover position calculation function 401 will now be described with reference to FIG. 7A and FIG. 7B. FIG. 7A and FIG. 7B are schematic diagrams illustrating a process in accordance with the mover position calculation function.

In FIG. 7A, the reference point Oe corresponds to a position reference of the stator 201 to which the linear encoder 204 is attached. Further, the reference point Os corresponds to a position reference of the linear scale 104 attached to the mover 101. FIG. 7A illustrates a case where two movers 101*a* and 101*b* are transported as the mover 101, and three linear encoders 204*a*, 204*b*, and 204*c* are arranged as the linear encoder 204. Note that the linear scales 104 are attached to the same positions of respective movers 101*a* and 101*b* along the X direction.

For example, the single linear encoder 204*c* faces the linear scale 104 of the mover 101*b* illustrated in FIG. 7A. The linear encoder 204*c* reads the linear scale 104 of the mover 101*b* and outputs a distance Pc. Further, the position of the linear encoder 204*c* on the X-axis whose origin is the reference point Oe is Sc. Therefore, the position Pos(101*b*) of the mover 101*b* can be calculated by the following Equation (1).

$$Pos(101b) = Sc - Pc \qquad \text{Equation (1)}$$

For example, two linear encoders 204*a* and 204*b* face the linear scale 104 of the mover 101*a* illustrated in FIG. 7A. The linear encoder 204*a* reads the linear scale 104 of the mover 101*a* and outputs the distance Pa. Further, the position of the linear encoder 204*a* on the X-axis whose origin is the reference point Oe is Sa. Therefore, the position Pos(101*a*) on the X-axis of the mover 101*a* based on the output of the linear encoder 204*a* can be calculated by the following Equation (2).

$$Pos(101a) = Sa - Pa \qquad \text{Equation (2)}$$

Further, the linear encoder 204*b* reads the linear scale 104 of the mover 101*a* and outputs the distance Pb. Further, the position of the linear encoder 204*b* on the X-axis whose origin is the reference point Oe is Sb. Therefore, the position Pos(101*a*)' on the X-axis of the mover 101*a* based on the output of the linear encoder 204*b* can be calculated by the following Equation (3).

$$Pos(101a)' = Sb - Pb \qquad \text{Equation (3)}$$

Herein, since respective positions of the linear encoders 204*a* and 204*b* have been measured accurately in advance, the difference of two values Pos(101*a*) and Pos(101*a*)' is sufficiently small. When the difference of the positions of the mover 101 on the X-axis based on the output of the two linear encoders 204 is sufficiently small in such a way, it can be determined that these two linear encoders 204 are observing the linear scale 104 of the same mover 101.

Note that, when a plurality of linear encoders 204 face the same mover 101, it is possible to uniquely determine the position of the observed mover 101 by calculating the average value of the positions based on the output of the plurality of linear encoders 204 or the like.

Further, the mover 101 may rotate around the Z-axis by a rotation amount Wz. A case where correction of the position of the mover 101 using the displacement of this rotation amount Wz is required will be described with FIG. 7B. FIG. 7B illustrates a case where the linear scale 104 is attached to one of the side faces in the Y direction of the mover 101*b*. The position Os is the origin of the linear scale 104, and the position Oc is the origin of the mover 101*b*. When the distance from the center Oc of the mover 101 to the linear scale 104 is D, more accurate position of the mover 101*b* can be obtained by calculating the position Pos(101*b*) of the mover 101*b* by using the following Equation (1b).

$$Pos(101b) = Sc - Pc - Wz*D \qquad \text{Equation (1b)}$$

The mover position calculation function 401 is used to calculate and determine the position X in the X direction of the mover 101 as the mover position information based on the output of the linear encoder 204 as described above.

Next, the process by using the mover attitude calculation function 402 will be described with reference to FIG. 8, FIG. 9A, and FIG. 9B.

Figure 8:
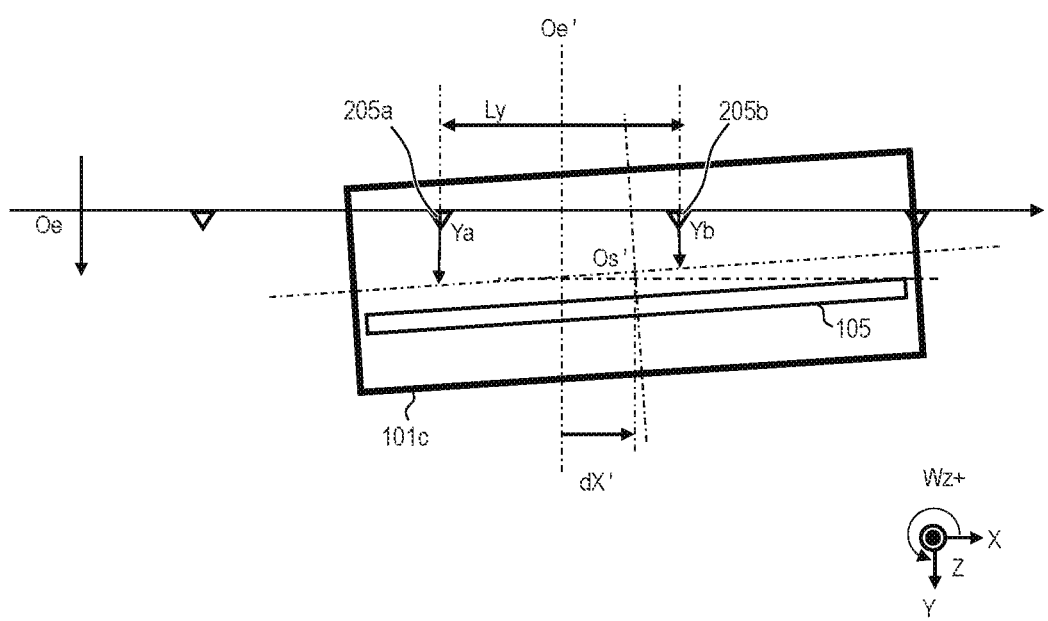
FIG. 8 is a schematic diagram illustrating a process using a mover attitude calculation function in the transport system according to the first embodiment of the present invention.

FIG. 8 illustrates a case where a mover 101*c* is transported as the mover 101, and Y-sensors 205*a* and 205*b* are arranged as the Y-sensor 205. The two Y-sensors 205*a* and 205*b* face the Y-target 105 of the mover 101*c* illustrated in FIG. 8. The rotation amount Wz around the Z-axis of the mover 101*c* is calculated by the following Equation (4), where the values of relative distances output by the two Y-sensors 205*a* and 205*b* are Ya and Yb, respectively, and the spacing between the Y-sensors 205*a* and 205*b* is Ly.

$$Wz = (Ya - Yb)/Ly \qquad \text{Equation (4)}$$

Note that three or more Y-sensors 205 may face the Y-target 105 for a particular position of the mover 101. In such a case, the inclination of the Y-target 105, that is, the rotation amount Wz around the Z-axis can be calculated by using a least-squire method or the like.

Figure 9A:
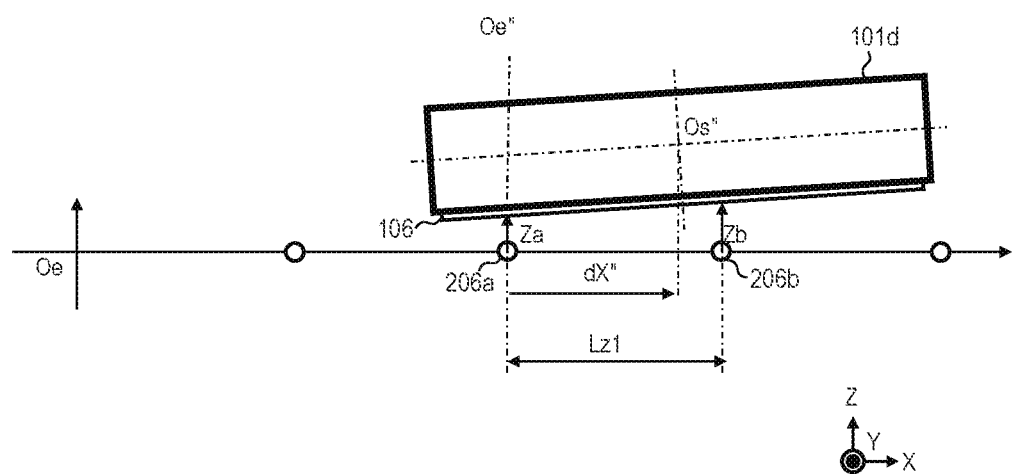
FIG. 9A is a schematic diagram illustrating a process using a mover attitude calculation function in the transport system according to the first embodiment of the present invention.
Figure 9B:
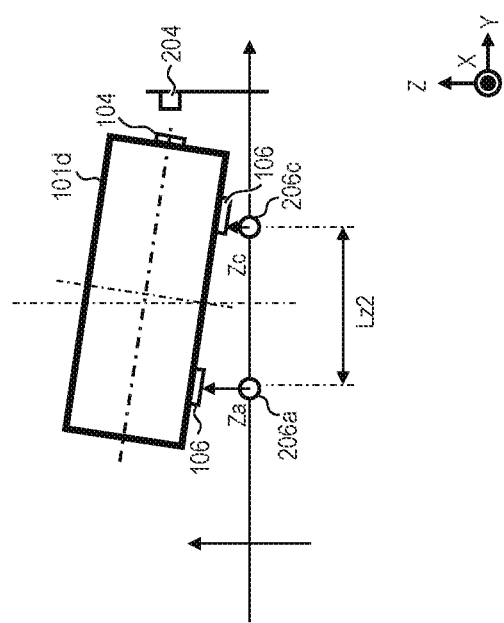
FIG. 9B is a schematic diagram illustrating a process using a mover attitude calculation function in the transport system according to the first embodiment of the present invention.

Further, FIG. 9A and FIG. 9B illustrate a case where a mover 101*d* is transported as the mover 101, and Z-sensors 206*a*, 206*b*, and 206*c* are arranged as the Z-sensor 206. The three Z-sensors 206*a*, 206*b*, and 206*c* face the Z-target 106 of the mover 101*d* illustrated in FIG. 9A and FIG. 9B. Herein, the values of relative distances output by the three Z-sensors 206*a*, 206*b*, and 206*c* are Za, Zb, and Zc, respectively. Further, the distance between sensors in the X direction, that is, the distance between the Z-sensors 206*a* and 206*b* is Lz1. Further, the distance between sensors in the Y direction, that is, the distance between the Z-sensors 206*a* and 206*c* is Lz2. Then, the rotation amount Wy around the Y-axis and the rotation amount Wx around the X-axis can be calculated by the following Equations (5a) and (5b), respectively.

$$Wy = (Zb - Za)/Lz1 \qquad \text{Equation (5a)}$$

$$Wx = (Zc - Za)/Lz2 \qquad \text{Equation (5b)}$$

With the mover attitude calculation function 402, it is possible to calculate the rotation amounts Wx, Wy, and Wz around respective axes as attitude information on the mover 101, as described above.

Further, with the mover attitude calculation function 402, it is possible to calculate the position Y in the Y direction and the position Z in the Z direction of the mover 101 as attitude information on the mover 101 as follows.

First, calculation of the position Y in the Y direction of the mover 101 will be described with reference to FIG. 8. In FIG. 8, two Y-sensors 205 faced by the mover 101*c* are Y-sensors 205*a* and 205*b*, respectively. Further, the measured values of the Y-sensors 205*a* and 205*b* are Ya and Yb, respectively. Further, the middle point of the position of the Y-sensor 205*a* and the position of the Y-sensor 205*b* is denoted as Oe'. Furthermore, the position of the mover 101*c* obtained by Equations (1) to (3) is denoted as Os', and the distance from Oe' to Os' is denoted as dX'. At this time, the position Y in the Y direction of the mover 101*c* can be calculated by approximate calculation with the following Equation (6).

$$Y = (Ya+Yb)/2 - Wz*dX' \quad \text{Equation (6)}$$

Next, calculation of the position Z in the Z direction of the mover 101 will be described with reference to FIG. 9A and FIG. 9B. Three Z-sensors 206 faced by the mover 101d are Z-sensors 206a, 206b, and 206c, respectively. Further, the measured values of the Z-sensors 206a, 206b, and 206c are Za Zb, and Zc, respectively. Further, the X-coordinate of the Z sensor 206a and the X-coordinate of the Z-sensor 206c are the same. Further, the linear encoder 204 is located in an intermediate position between the Z-sensor 206a and the Z-sensor 206c. Further, the position X of the Z-sensor 206a and the Z-sensor 206c is denoted as Oe". Furthermore, the distance from Oe" to the center Os" of the mover 101 is denoted as dX". At this time, the position Z in the Z direction of the mover 101 can be calculated by approximate calculation with the following Equation (7).

$$Z = (Za+Zb)/2 + Wy*dX'' \quad \text{Equation (7)}$$

Note that, when both the rotation amounts of Wz and Wy are large for the position Y and the position Z, calculation can be performed at higher approximation accuracy.

In such a way, the integration controller 301 functions as an acquisition unit that acquires the position and the attitude (X, Y, Z, Wx, Wy, Wz) of the mover 101 by performing the process using the mover position calculation function 401 and the mover attitude calculation function 402.

Next, a method of determining current values to be applied to the coils 202, 207, and 208 used for applying desired force T to the mover 101 will be described. The force T applied to the mover 101 includes Tx, Ty, and Tz, which are three-axis components of force, and Twx, Twy, and Twz, which are three-axis components of torque, as described above. The integration controller 301 that performs a process using the coil current calculation function 404 can determine current values to be applied to the coils 202, 207, and 208 in accordance with the method of determining current values described below.

Note that, out of the force components and the torque components applied by the coils 202, 207, and 208, influence from one force component or torque component caused to the other force components or torque components may be sufficiently negligible for some cases. Specifically, the force and torque applied by the coils 202, 207, and 208 is formed of the force in X direction applied by the coil 207, the force in the Y direction and the torque in the Wz direction applied by the coil 208, and the force in the Z direction, the torque in the Wx direction, and the torque in the Wy direction applied by the coil 202. The force in the Y direction and the torque in the Wz direction applied by the coil 208 work in the horizontal direction. The force in the Z direction, the torque in the Wx direction, and the torque in the Wy direction applied by the coil 202 work in the floating direction. When the influence is sufficiently negligible, the current values can be calculated taking into consideration of only the force in the X direction for the coil 207, the force in the Y direction and the torque in the Wz direction for the coil 208, and the force in the Z direction, the torque in the Wx direction, and the torque in the Wy direction for the coil 202. A case where the influence can be sufficiently neglected will be described below.

First, current applied to each coil 202 for applying the force component Tz in the Z direction, the torque component Twx in the Wx direction, and the torque component Twy in the Wy direction to the mover 101 will be described with reference to FIG. 10 to FIG. 12B.

Figure 10:
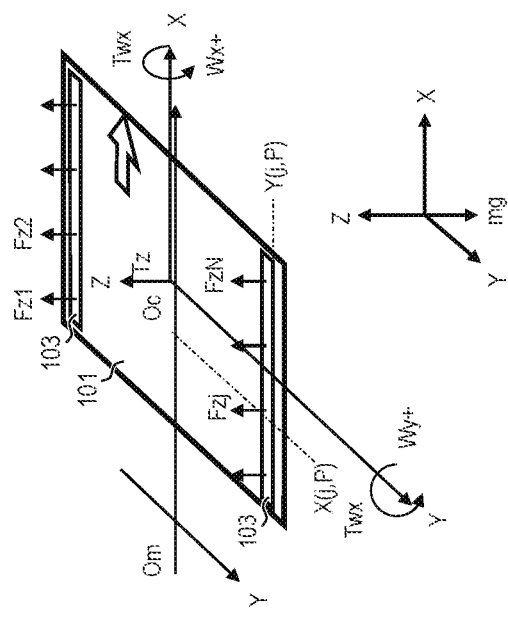
FIG. 10 is a schematic diagram illustrating a relationship between force working on a yoke plate attached to the mover and the force component and the torque component working on the mover in the transport system according to the first embodiment of the present invention.

FIG. 10 is a schematic diagram illustrating a relationship between the force working on the yoke plate 103 attached to the mover 101 and the force component Tz and the torque components Twx and Twy working on the mover 101.

In FIG. 10, Fzj denotes force applied to the yoke plate 103 by the j-th coil 202. Note that j is an integer satisfying 1≤j≤N, where the number N of installed coils 202 is an integer greater than or equal to two. The torque applied by each force Fzj contributes to the torque components Twx and Twy. The torque applied by each force Fzj is determined in accordance with the force Fzj and the distance between the point of action and the center Oc of the mover 101.

Figure 11:
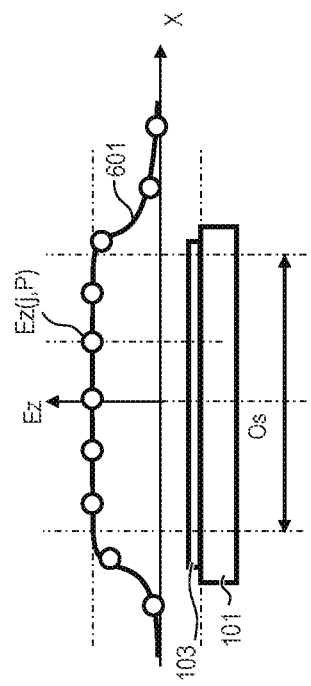
FIG. 11 is a graph schematically illustrating a thrust constant profile in the Z direction in the transport system according to the first embodiment of the present invention.

FIG. 11 is a graph schematically illustrating a thrust constant profile 601 in the Z direction. The thrust constant profile 601 schematically illustrates attractive force working on the yoke plate 103 when unit current is applied to the coil 202 used for floating that faces the yoke plate 103. The magnitude of the attractive force continuously changes with respect to the motion in the X direction.

Figure 12A:
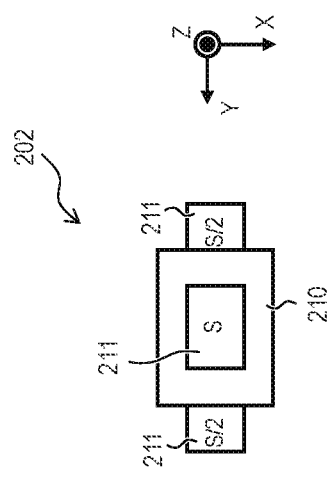
FIG. 12A is a schematic diagram illustrating a coil of a stator in the transport system according to the first embodiment of the present invention.
Figure 12B:
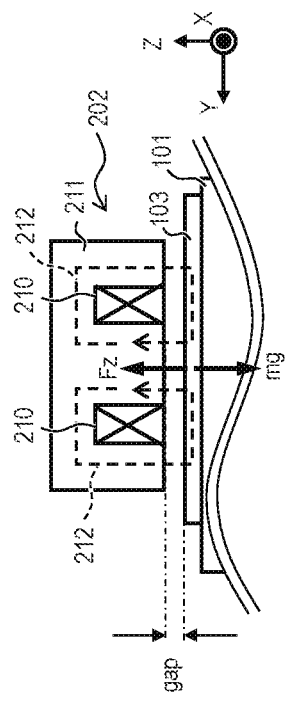
FIG. 12B is a schematic diagram illustrating the coil of the stator in the transport system according to the first embodiment of the present invention.

An example of a configuration of the coil 202 will now be described with reference to FIG. 12A and FIG. 12B. FIG. 12A and FIG. 12B are schematic diagrams illustrating the coil 202. FIG. 12A is a diagram of the coil 202 when viewed from the Z-axis direction, and FIG. 12B is a diagram of the coil 202 when viewed from the X-axis direction.

As illustrated in FIG. 12A and FIG. 12B, the coil 202 has a winding 210 and a core 211. Current is applied to the winding 210 by the current controller 313. In response to application of current to the winding 210, a magnetic path 212 that is a path of a magnetic flux is formed. Attractive force works between the coil 202 and the yoke plate 103 due to the magnetic flux in the magnetic path 212 formed in such a way.

Figure 13:
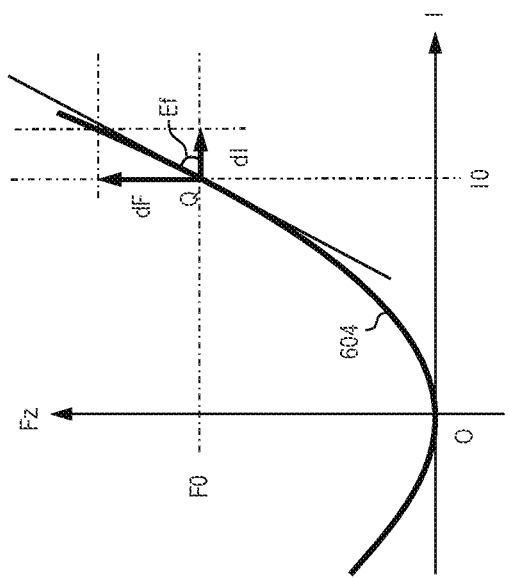
FIG. 13 is a graph schematically illustrating a relationship between the current amount applied to a coil and the magnitude of attractive force working between the coil and the yoke plate in the transport system according to the first embodiment of the present invention.

The relationship between the current applied to the coil 202 and the magnitude of the attractive force working between the coil 202 and the yoke plate 103 will be described in more detail with reference to FIG. 12A to FIG. 13. FIG. 13 is a graph schematically illustrating the relationship between the current applied to the coil 202 and the magnitude of the attractive force working between the coil 202 and the yoke plate 103. In the graph illustrated in FIG. 13, the horizontal axis represents the current amount I applied to the coil 202, and the vertical axis represents the magnitude of attractive force Fz working between the coil 202 and the yoke plate 103. The graph illustrated in FIG. 13 indicates an attractive force profile 604 indicating the magnitude of attractive force Fz to the current amount I.

When the spacing in the Z direction between the coil 202 and the yoke plate 103 is constant, the attractive force Fz is approximately proportional to the square of the current amount I. Herein, in the graph illustrated in FIG. 13, F0 represents an average magnitude of force working on each coil 202 required for compensating the gravity mg working on the mover 101.

Herein, numeric values and symbols are set as follows.

Bottom area of the core 211 of one coil 202: S=0.01 [m$^2$]

A part of the mass of the mover 101 compensated by one coil 202: F0=100 [N] (around 10 [kg])

Vacuum magnetic permeability: $\mu 0 = 4\pi \times 10^{-7}$

Airgap: gap [m]

Number of turns of the winding 210 of the coil 202: n [turn]

Coil current: I [A]

Magnetic flux density between the core 211 and the yoke plate 103: B [T]

If the magnetic permeability of the core 211 and the yoke plate 103 is sufficiently large relative to the vacuum magnetic permeability, Fz and B can be approximately calculated by the following Equation (8a) and (8b), respectively.

$$Fz=S*B^2/(2*\mu 0) \quad \text{Equation (8a)}$$

$$B=N*I*\mu 0/(2*gap) \quad \text{Equation (8b)}$$

Herein, when the number of turns is 500 [turn] and the coil current I0 is 1.0 [A], the airgap "gap" can be calculated to be 0.006266 [m] by Equation (8a) and Equation (8b).

Herein, in the attractive force profile 604, a point where I=I0 leading to Fz=F0 is Q. A part around this point Q will be described.

If the "gap" changes in the expansion direction by 0.25 [mm] from 0.006266 [m], it is necessary to generate larger magneto-motive force in the coil 202 in order to compensate the expanding "gap". If the "gap" is 0.006516 [m] and Equations (8a) and (8b) are calculated so as to generate the same Fz, the coil current I is calculated to be 1.0399 [A]. Because of such a level of current value, the variation in the current value of the coil current during transportation of the mover 101 is sufficiently small compared to the coil current I0 that is a reference.

Therefore, around the point Q, the relationship expressed in the following Equation (8c) is met between current dI applied in addition to the current I0 and the magnitude of force dF additionally generated in the Z-axis direction by application of current dI. Note that the relationship expressed by Equation (8c) is not met around the origin O.

$$dF \propto dI \quad \text{Equation (8c)}$$

Herein, the ratio of dF and dI is defined by the following Equation (8d).

$$dF/dI=Ez \quad \text{Equation (8d)}$$

In the thrust constant profile 601 illustrated in FIG. 11, Ez(j, P) is indicated. Ez(j, P) has a ratio indicated by Equation (8d). That is, Ez(j, P) represents the ratio of the magnitude of force dF additionally generated in the Z-axis direction to the current Id when the additional current dI is applied to the current I0 being applied on average to the j-th coil 202 when the mover 101 is in the position and attitude P.

Description is provided with reference to FIG. 10 in accordance with the denotation described above, where j is the index identifying the coil 202. In the following, for simplified illustration, additional force dFzj in the Z direction is simply denoted as Fzj, and the additional current dIj is denoted as Ij.

The additional force Fzj generated in the Z direction by the j-th coil 202 is expressed by the following Equation (9a), where Ij represents additional current applied to the j-th coil 202.

$$Fzj=Ez(j,P)*Ij \quad \text{Equation (9a)}$$

Furthermore, X(j, P) is defined as the relative position in the X direction of the j-th coil 202 when viewed from the origin Oc of the mover 101, and Y(j, P) is defined as the relative position in the Y direction of the j-th coil 202 when viewed from the origin Oc of the mover 101. Then, the force component Tz in the Z direction, the torque component Twx in the Wx direction, and the torque component Twy in the Wy direction are expressed by the following Equations (9b), (9c), and (9d), respectively.

$$Tz=\Sigma(Ez(j,P)*Ij) \quad \text{Equation (9b)}$$

$$Twx=\Sigma(-Ez(j,P)*Y(j,P)*Ij) \quad \text{Equation (9c)}$$

$$Twy=\Sigma(Ez(j,P)*X(j,P)*Ij) \quad \text{Equation (9d)}$$

If the current Ij satisfying the above Equations (9b), (9c), and (9d) is applied to each coil 202, desired force component and torque component (Tz, Twx, Twy) can be obtained.

The torque contribution matrix M is defined here. The torque contribution matrix M is a matrix indicating the magnitude of contribution to each force component and torque component (Tz, Twx, Twy) when unit current is applied to each of the first to j-th coils 202 when the mover 101 is in the position and attitude P. In such a way, the torque contribution matrix M is used and information related to contribution to each component of the force component and the torque component (Tz, Twx, Twy) caused by unit current applied to each coil 202 is used to determine the current value applied to each coil 202.

In the torque contribution matrix M, the first row is associated with the Z direction, the second row is associated with the Wx direction, and the third row is associated with the Wy direction. Then, respective elements M(1, j), M(2, j), and M(3, j) on the first row on the j-th column, the second row on the j-th column, and the third row on the j-th column of the torque contribution matrix M are expressed by the following Equations (10a), (10b), and (10c), respectively. The torque contribution matrix M is a matrix of three rows by N columns. Note that respective rows of the torque contribution matrix M are linearly independent of each other.

$$M(1,j)=Ez(j,P) \quad \text{Equation (10a)}$$

$$M(2,j)=-Ez(j,P)*Y(j,P) \quad \text{Equation (10b)}$$

$$M(3,j)=Ez(j,P)*X(j,P) \quad \text{Equation (10c)}$$

On the other hand, a column vector whose elements are current amounts I1 to IN to be applied to the first to N-th coils 202 is introduced with a coil current vector Is. The coil current vector Is is a column vector on the N-th row on the first column expressed by the following Equation (10d).

$$Is=Tr(I1,I2,\ldots,Ij,\ldots,IN) \quad \text{Equation (10d)}$$

The torque vector Tq is defined here as the following Equation (11).

$$Tq=Tr(Tz,Twx,Twy) \quad \text{Equation (11)}$$

Then, the following Equation (12) is obtained from Equations (9b) to (9d), (10a) to (10d), and (11).

$$Tq=M*Is \quad \text{Equation (12)}$$

The pseudo current vector K is introduced here. The pseudo current vector K is a column vector having three rows by one column and is a vector satisfying the following Equation (13) when Tr(M) is a transpose matrix of the torque contribution matrix M.

$$Tr(M)*K=Is \quad \text{Equation (13)}$$

Since it is possible to apply a larger current value to the coil 202 which more contributes to Tz, Twx, and Twy by defining the coil current vector Is as a vector expressed by Equation (13), it is possible to apply current efficiently.

Equation (12) can be transformed into the following Equation (14) by using Equation (13).

$$Tq=M*Tr(M)*K \quad \text{Equation (14)}$$

In Equation (14), M*Tr(M) is a product of a matrix of three rows by N columns and a matrix of N rows by three columns and thus is a square matrix of three rows by three columns. Further, respective rows of the torque contribution matrix M are linearly independent of each other. Therefore, an inverse matrix can be obtained from M*Tr(M) in any cases. Thus, Equation (14) can be transformed into the following Equation (15).

$$K=Inv(M*Tr(M))*Tq \quad \text{Equation (15)}$$

The coil current vector Is expressed by the following Equation (16) is finally obtained from Equations (13) and (15). In such a way, the coil current vector Is can be uniquely found.

$$Tr(M)*Inv(M*Tr(M))*Tq=Is \quad \text{Equation (16)}$$

By calculating the coil current vector Is as described above, it is possible to determine current to be applied to each coil 202. Accordingly, since it is possible to independently apply the force component Tz in Z direction, the torque component Twx in the Wx direction, and the torque component Twy in the Wy direction to the mover 101, it is possible to stabilize the attitude of the mover 101 in the Z direction, the Wx direction, and the Wy direction.

Figure 14:
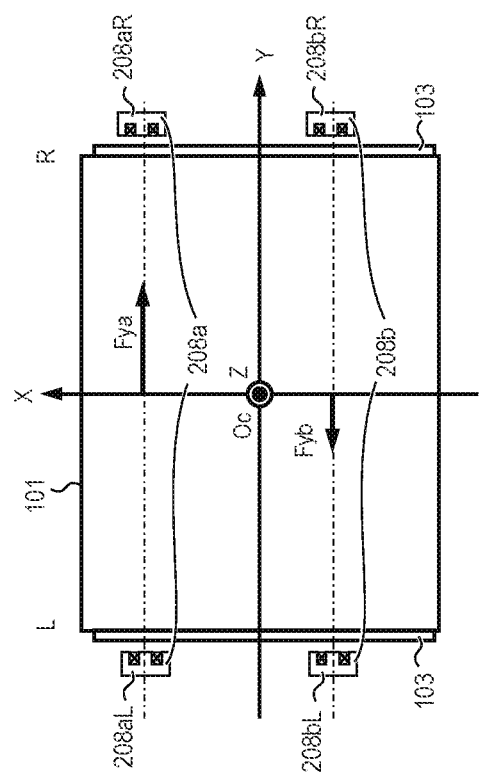
FIG. 14 is a schematic view of the mover in the transport system according to the first embodiment of the present invention when viewed from the top to the bottom in the Z direction.
Figure 15:
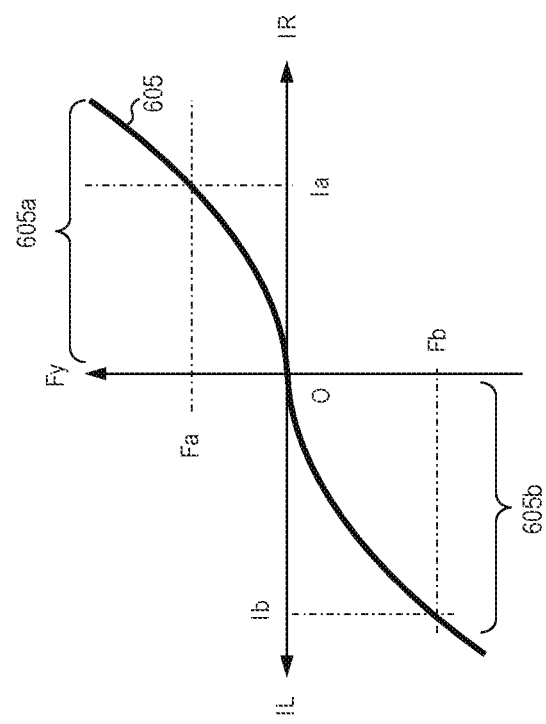
FIG. 15 is a graph schematically illustrating an attractive force profile in the Y direction in the transport system according to the first embodiment of the present invention.

Next, current applied to the coil 208 for applying the force component Ty in the Y direction and the torque component Twz in the Wz direction to the mover 101 will be described with reference to FIG. 14 and FIG. 15. The force component Ty and the torque component Twz work in the horizontal direction, respectively. FIG. 14 is a schematic diagram of the mover 101 when viewed from the top to the bottom in the Z direction. FIG. 15 is a graph schematically illustrating an attractive force profile 605 in the Y direction. In the graph illustrated in FIG. 15, the horizontal axis represents current applied to the coil 208, and the vertical axis represents force working on the mover 101.

Note that, for simplified illustration, FIG. 14 illustrates a case where, as the coils 208 installed on the stator 201, four coils 208aR, 208bR, 208aL, and 208bL face the mover 101. Further, the coil 208aL and the coil 208aR are paired to operate as one coil 208a. Further, the coil 208bL and the coil 208bR are paired to operate as one coil 208b. In such a way, the j-th paired coil 208jR and coil 208jL are paired to operate as one coil 208j.

The attractive force profile 605 illustrated in FIG. 15 indicates the relationship between the level of current IL and IR applied to the j-th pair of coils 208j and the magnitude of the force Fy working on the mover 101. No repulsive force works and only the attractive force works between the coil 208 and the yoke plate 103. Thus, when force is applied in +Y direction to the mover 101, current is applied to the coil 208jR on the R side in a range 605a of the attractive force profile 605. Further, when force is applied in −Y direction to the mover 101, current is applied to the coil 208jL on the L side in a range 605b of the attractive force profile 605.

For example, when force Fa in the +Y direction is applied, current Ia can be applied to the coil 208jR on the R side. Further, for example, when force Fb in the −Y direction is applied, current Ib can be applied to the coil 208jL on the L side.

The index j is defined as an index identifying a pair of coils 208. Further, X(j, P) is defined as the relative position in the X direction of the j-th pair of coils 208 when viewed from the origin Oc of the mover 101. Further, force in the Y direction applied by the j-th pair of coils 208 is denoted as Fyj. Then, the force component Ty in the Y direction and the torque component Twz in the Wz direction that correspond to the horizontal direction are expressed by the following Equations (17a) and (17b), respectively.

$$Ty=\Sigma Fyj \quad \text{Equation (17a)}$$

$$Twz=\Sigma(-Fyj*X(j,P)) \quad \text{Equation (17b)}$$

A Y direction force vector Fys having elements of force Fy1, Fy2, . . . , FyN in the Y direction applied by the first to N-th coils 208 is defined here by the following Equation (17c).

$$Fys=Tr(Fy1,Fy2,\ldots,Fyj,\ldots,FyN) \quad \text{Equation (17c)}$$

Furthermore, the torque vector Tq is defined by the following Equation (17d).

$$Tq=Tr(Ty,Twz) \quad \text{Equation (17d)}$$

In the torque contribution matrix M, the first row is associated with the Y direction, and the second row is associated with the Wz direction. Then, respective elements M(1, j) and M(2, j) on the first row on the j-th column and the second row on the j-th column of the torque contribution matrix M are expressed by the following Equations (17e) and (17f), respectively.

$$M(1,j)=1 \quad \text{Equation (17e)}$$

$$M(2,j)=X(j,P) \quad \text{Equation (17f)}$$

To calculate current to be applied to the coil 208, first, the Y direction force vector Fys satisfying the following Equation (17g) is determined.

$$Tq=M*Fys \quad \text{Equation (17g)}$$

Since Tq is a vector of two rows by one column and M is a matrix of two rows by N columns, there are innumerable combinations of elements of the Y direction force vector Fys satisfying Equation (17g), however, the combination can be calculated uniquely in accordance with the following method.

Herein, the pseudo current vector K of two rows by one column is introduced. The pseudo current vector K is a vector satisfying the following Equation (17h), where Tr(M) is a transpose matrix of the torque contribution matrix M.

$$Tr(M)*K=Fys \quad \text{Equation (17h)}$$

Equation (17g) can be transformed into the following Equation (17i) by using Equation (17h).

$$Tq=M*Tr(M)*K \quad \text{Equation (17i)}$$

The item M*Tr(M) is a product of a matrix of two rows by N columns and a matrix of N rows by two columns and thus is a square matrix of two rows by two columns. Further, respective rows of the torque contribution matrix M are linearly independent of each other. Therefore, an inverse matrix can be obtained from M*Tr(M) in any cases. Thus, Equation (17i) can be transformed into the following Equation (17j).

$$K=Inv(M*Tr(M))*Tq \quad \text{Equation (17j)}$$

The Y direction force vector Fys expressed by the following Equation (17k) is finally obtained from Equations (17h) and (17j). Accordingly, the Y direction force vector Fys can be uniquely calculated.

$$Tr(M)*Inv(M*Tr(M))*Tq=Fys \quad \text{Equation (17k)}$$

After the Y direction force vector Fys is obtained, current to be applied to each coil 208 can be calculated by counting backward from the attractive force profile 605 calculated or measured in advance.

As described above, the current to be applied to each coil 208 can be determined. Accordingly, since the force component Ty in the Y direction and the torque component Twz in the Wz direction can be independently applied to the mover 101, the attitude of the mover 101 can be stabilized in the Y direction and the Wz direction. For example, current can be applied to the coil 208 so that the torque in the Wz direction is always 0.

As described above, in the present embodiment, the current values applied to the plurality of coils 202 and 208 are controlled.

Next, a control method of the coil 207 that applies thrust in the X direction, which is the transport direction, to the mover 101 will be described. The transport system 1 according to the present embodiment is a transport system with an induction type linear motor. The coil 207 generates electromagnetic force between the coil 207 and the conductive plate 107 of the mover 101 and applies thrust in the X direction, that is, the force component Tx in the X direction to the mover 101. The conductive plate 107 is not particularly limited, and a plate whose electric resistance is relatively small, for example, an aluminum plate is used.

When current is applied, each coil 207 generates a moving magnetic field in the X direction, which is the transport direction, to generate electromagnetic force between the coil 207 and the conductive plate 107. Thereby, each coil 207 causes the mover 101 to generate the force component Tx as the thrust in the X direction, which is the transport direction. When the speed of the mover 101 is insufficient, it is possible to increase the current to be applied to each coil 207 or change the timing of application of current to each coil 207 so that the speed at which the moving magnetic field moves becomes higher.

As described above, the integration controller 301 determines and controls the current instruction values of current to be applied to respective coils 202, 207, and 208. Accordingly, the integration controller 301 controls transportation of the mover 101 on the stator 201 in a contactless manner while controlling in six axes the attitude of the mover 101 being transported by the stator 201. Note that all or a part of the function of the integration controller 301 as the control apparatus may be replaced with the coil controller 302 as well as other control apparatuses.

Note that, although the case where the current of the coil 207 is controlled in the same manner as the current of the coil 202 and the coil 208 has been described in the present embodiment, the embodiment is not limited thereto. For example, in a simpler configuration, an induction motor controller may be connected to the integration controller 301, and the current of each coil 207 may be controlled by the induction motor controller so that a constant moving magnetic field is generated.

As described above, according to the present embodiment, it is possible to apply the force component and the torque component in the six axes (Tx, Ty, Tz, Twx, Twy, Twz) independently to the mover 101. Thus, according to the present embodiment, it is possible to transport the mover 101 in a contactless manner stably in the X direction while stabilizing the attitude of the mover 101 in the Y direction, the Z direction, the Wx direction, the Wy direction, and the Wz direction.

The transport system 1 according to the present embodiment can transport the mover 101 to the work area 707 of the assembling apparatus 701 while controlling the attitude of the mover 101 as described above, and land the mover 101 in the Z direction in the work area 707 to stop the mover 101. The transport system 1 can stop the mover 101 by landing the mover 101 in the work area 707 by adjusting the stop position of the mover 101 so that each of the Z-axis positioning parts 706 on the side of the mover 101 comes into contact with the corresponding Z-axis positioning part 705 on the side of the stator 201.

The assembling robot 703 of the assembling apparatus 701 performs processing operation such as assembling operation of a component 704 to a workpiece 102 attached on or held by a mover 101 to be mounted on the mover 101 carried in a work area 707. Specifically, the assembling robot 703 assembles the component 704 in the Z direction with respect to the workpiece 102 mounted on the mover 101. During the processing operation, as illustrated in FIG. 2A and FIG. 2B, an external force 704F is applied to the workpiece 102 and the mover 101 in the −Z direction during the processing by the assembling robot 703 that assembles the component 704 in the Z direction.

On the other hand, when the component 704 is assembled in the Z direction in this way, in the present embodiment, the Z-axis positioning part 705 on the side of the stator 201 and the Z-axis positioning part 706 on the side of the mover 101 are in contact with each other. Thus, the external force 704F during the processing can be received by the Z-axis positioning part 705 and the Z-axis positioning part 706 in contact with each other. At this time, the Z-axis positioning parts 705 and 706 function as stoppers that limits the movable range of the mover 101 in the Z direction. Thus, in the present embodiment, the mover 101 can maintain a stable position with respect to the external force 704F during the processing, and the workpiece 102 can be accurately positioned. Note that the Z-axis positioning parts 705 and 706 may be configured to be movable in the −Z direction to which the external force 704F is applied when the external force 704F is applied.

Further, as illustrated in FIG. 2B, each set of the Z-axis positioning part 705 and the Z-axis positioning part 706 which are in contact with each other constitutes a support structure 708 that supports the mover 101 landed in the Z direction. The support structure 708 is constituted by arranging the Z-axis positioning part 705 and the Z-axis positioning part 706 in contact with each other at all or a part of a plurality of apexes of a polygon. The support structure 708 may comprise one or two sets of the Z-axis positioning part 705 and the Z-axis positioning part 706 which are in contact with each other.

The Z-axis positioning parts 705 and 706 constituting the support structure 708 are arranged so that the direction vector of the external force 704F during the processing is inside the support structure 708 constituted of the Z-axis positioning parts 705 and 706. Thus, the rotational force working on the workpiece 102 and the mover 101 by the external force 704F at the time of the processing can be reduced, and furthermore the generation of such rotational force can be prevented. Thus, in the present embodiment, the position of the mover 101 can be stabilized regardless of the magnitude of the external force 704F in the Z direction applied to the mover 101 during the processing of the workpiece 102, especially even against the large external force 704F during the processing. Further, in the present embodiment, by stabilizing the position of the mover 101, the workpiece 102 can be positioned with high accuracy.

Figure 16:
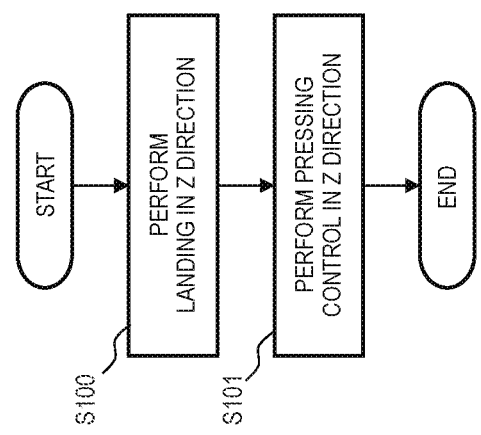
FIG. 16 is a flow chart illustrating a method of controlling the transport system according to the first embodiment of the present invention.

Next, a control method of the transport system 1 for positioning the mover 101 using the Z-axis positioning part 705 on the side of the stator 201 and the Z-axis positioning part 706 on the side of the mover 101 will be described with reference to FIG. 16. FIG. 16 is a flowchart illustrating the control method of the transport system 1 for positioning the mover 101 according to the present embodiment. A computer functioning as the integration controller 301 can execute the control method illustrated in FIG. 16 by reading a program for executing the control method illustrated in FIG. 16 from a computer-readable storage medium and executing the program.

First, the integration controller 301 controls the floating transport of the mover 101 including the workpiece 102 by controlling the current command values of the currents applied to the coils 202, 207, and 208. Thus, the integration controller 301 transports the mover 101 in the X direction while floating the mover 101 in the +Z direction to the upper side of the Z-axis positioning parts 705 on the side of the stator 201 in the work area 707. Thereafter, the integration controller 301 positions the mover 101 during the processing by the assembling robot 703 of the assembling apparatus 701 in accordance with the process of the flowchart illustrated in FIG. 16.

First, the integration controller 301 executes step S100 to land the mover 101 in the Z direction, which is the processing axis direction. The processing axis direction is a direction in which processing is performed by the assembling robot 703. When the mover 101 lands in the Z direction, the integration controller 301 controls the current command value of current applied to each coil 202, 207, and 208 so that each Z-axis positioning part 706 on the side of the mover 101 comes into contact with the corresponding Z-axis positioning part 705 on the side of the stator 201.

Next, the integration controller 301 executes step S101 to perform pressing control for pressing the mover 101 in the Z direction. In the pressing control in the Z direction, the integration controller 301 presses the mover 101 in the −Z direction by controlling the current command value of the current applied to each coil 202 to control the force component Tz in the Z direction working on the mover 101. Thus, the integration controller 301 presses the Z-axis positioning part 706 on the side of the mover 101 to the Z-axis positioning part 705 on the side of the stator 201. When the Z-axis positioning part 706 is pressed against the Z-axis positioning part 705, the static frictional force in the X direction and the static frictional force in the Y direction are increased between the Z-axis positioning part 705 and the Z-axis positioning part 706 which are in contact with each other. Therefore, when the workpiece 102 is processed from the Z direction by the assembling robot 703, the movement of the mover 101 in the Z direction is restricted, and the position of the mover 101 is hardly shifted in the X direction and the Y direction. Thus, the integration controller 301 makes the mover 101 land in the Z direction, which is the direction of the external force 704F, and performs the pressing control to press the mover 101 so that the movement of the mover 101 in the Z direction is restricted by the Z-axis positioning parts 705 and 706.

As described above, the integration controller 301 performs the control for positioning the mover 101 while the assembling robot 703 processes the workpiece 102. After the completion of the processing, the integration controller 301 can terminate the control for positioning the mover 101 and perform the floating transport of the mover 101 again.

Thus, in the present embodiment, after the workpiece 102 is transported together with the mover 101, the mover 101 is positioned using the Z-axis positioning parts 705 and 706. Thus, the mover 101 can maintain a stable position against a large external force applied to the workpiece 102 when the workpiece 102 is processed. As a result, the workpiece 102 is accurately positioned, and the workpiece 102 is accurately processed by the process apparatus to manufacture an article.

As described above, according to the present embodiment, the position of the mover 101 can be stabilized regardless of the magnitude of the external force applied to the mover 101 during processing of the workpiece 102.

Second Embodiment

Figure 17A:
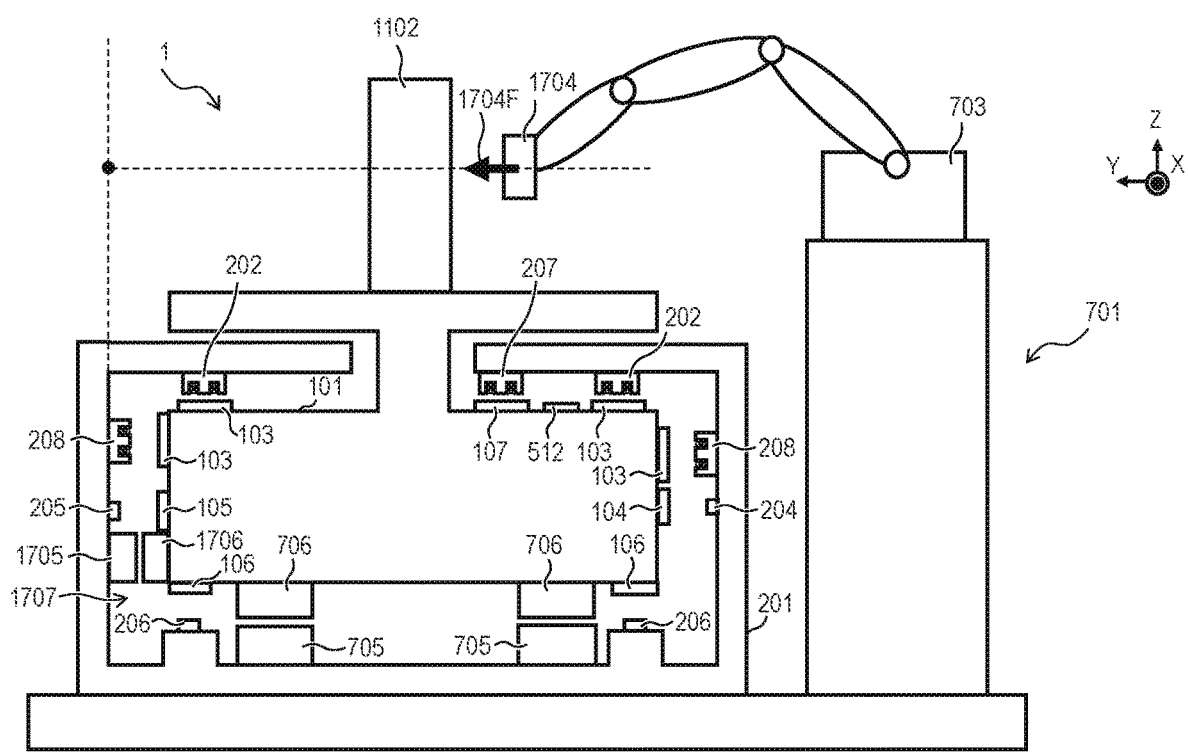
FIG. 17A is a schematic diagram illustrating a configuration of a transport system according to a second embodiment of the present invention.

A second embodiment of the present invention will be described with reference to FIG. 17A to FIG. 18. Note that the same components as those in the above first embodiment are labeled with the same references, and the description thereof will be omitted or simplified.

Figure 17B:
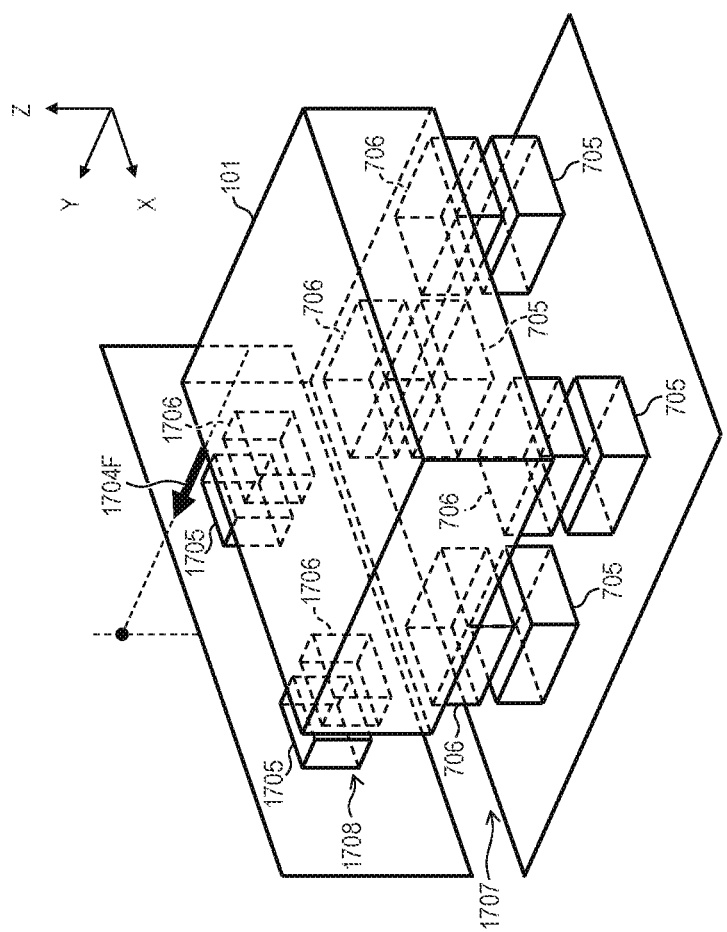
FIG. 17B is a schematic diagram illustrating the configuration of the transport system according to the second embodiment of the present invention.

First, the configuration of the transport system 1 according to the present embodiment will be described with reference to FIG. 17A and FIG. 17B. FIG. 17A and FIG. 17B are schematic views illustrating the configuration of the transport system 1 including the mover 101 and the stator 201 according to the present embodiment. Note that FIG. 17A illustrates the main parts of the mover 101 and the stator 201. FIG. 17B illustrates the mover 101, Y-axis positioning parts 1705 on the side of the stator 201, and Y-axis positioning parts 1706 on the side of the mover 101. FIG. 17A is a view of the mover 101 and the stator 201 viewed from the X direction, and FIG. 17B is a view of the mover 101 viewed from obliquely above.

The basic configuration of the transport system 1 according to the present embodiment is the same as that of the first embodiment. In addition to the configuration of the first embodiment, the transport system 1 according to the present embodiment includes Y-axis positioning parts 1705 on the side of the stator 201 and Y-axis positioning parts 1706 on the side of the mover 101 as positioning parts for positioning the mover 101 in the Y direction. The Y-axis positioning parts 1705 and 1706 are members that restrict the movement of the mover 101 in the Y direction, which is the direction of an external force 1704F to be applied to the workpiece 102 and the mover 101, which will be described later, when the workpiece 102 is processed.

The mover 101 is configured to be transported with a workpiece 1102 attached or held on or under the mover 101, for example. FIG. 17A illustrates a state in which the workpiece 1102 is attached on the mover 101 to be mounted on the mover 101. The mechanism for attaching or holding the workpiece 1102 on the mover 101 is not particularly limited, but a general attachment mechanism, a holding mechanism, or the like such as a mechanical hook, an electrostatic chuck, or the like, can be used.

The stator 201 has a plurality of Y-axis positioning parts 1705. The Y-axis positioning part 1705 has surface accuracy of a surface facing the Y direction, and can be used as a positioning reference in the Y direction. The mover 101 has a plurality of Y-axis positioning parts 1706 corresponding to the plurality of Y-axis positioning parts 1705. The Y-axis positioning part 1706 has surface accuracy of a surface facing the Y direction, and can be used as a positioning reference in the Y direction.

In the stator 201, the plurality of Y-axis positioning parts 1705 are installed on the side surface of the area where the mover 101 lands. The area where the mover 101 lands is a work area 1707 where the assembling apparatus 701 assembles a component 1704 to the workpiece 1102 on the mover 101. The plurality of Y-axis positioning parts 1705 are columnar members having side surfaces parallel to the XZ plane facing the −Y direction. The side surfaces of the plurality of Y-axis positioning parts 1705 are positioned at the same position in the Y direction. The plurality of Y-axis positioning parts 1705 are provided on a side surface which is an inner wall surface of the stator 201. The material of the Y-axis positioning parts 1705 may be the same as that of the stator 201. In this case, the plurality of Y-axis positioning parts 1705 are formed integrally with the stator 201. Elastic bodies or body such as rubber (not shown) may be provided between the plurality of Y-axis positioning parts 1705 and the side surfaces of the stator 201. The Z-axis positioning parts 705 are provided on the floor surface of the work area 1707 in the same manner as in the first embodiment. Note that the Z-axis positioning parts 705 do not necessarily have to be provided.

In the mover 101, the plurality of Y-axis positioning parts 1706 are provided on the side surface facing the side surface on which the Y-axis positioning parts 1705 of the stator 201 are provided. The plurality of Y-axis positioning parts 1706 are columnar members having side surfaces parallel to the XZ plane facing the +Y direction. The side surfaces of the plurality of Y-axis positioning parts 1706 are positioned at the same position in the Y direction. The plurality of Y-axis positioning parts 1706 are arranged at positions that can face the corresponding Y-axis positioning parts 1705. On the lower surface of the mover 101, the Z-axis positioning parts 706 are provided as in the first embodiment. It should be noted that the Z-axis positioning part 706 does not necessarily have to be installed.

As will be described later, the mover 101 floated in the +Z direction and transported in the X direction lands in the Y direction so that the side surface of each Y-axis positioning part 1706 contacts the side surface of the corresponding Y-axis positioning part 1705 in the work area 1707. The landing mover 101 floats again in the Y direction and can be transported. The Y-axis positioning parts 1705 and 1706 are provided inside the movable range in the Y direction of the mover 101 so that the mover 101 can float again in the Y direction.

The mover 101 and the stator 201 are provided with a process apparatus for illustrates performing a processing operation on the workpiece 1102 transported by the mover 101. FIG. 17A illustrates a case where the mover 101 and the stator 201 are incorporated in the assembling apparatus 701, which is an example of a process apparatus for performing a processing operation on the workpiece 1102.

The assembling apparatus 701 has an assembling robot 703 that performs the assembling operation to the workpiece 1102 attached to a mover 101. In the assembling operation, a component 1704 are assembled to the workpiece 1102. The assembling robot 703 is installed in the assembling apparatus 701 so as to be capable of executing the assembling operation with respect to the workpiece 1102 attached to the upper part of the mover 101. The assembling robot 703 assembles the component 1704 from the Y direction to the workpiece 1102 attached on the upper part of the mover 101 transported to the work area 1707 in front of the installation place of the assembling robot 703.

The transport system 1 according to the present embodiment can transport the mover 101 to the work area 1707 of the assembling apparatus 701 while controlling the attitude of the mover 101 in the same manner as in the first embodiment, and land the mover 101 in the Y direction in the work area 1707 and stop the mover 101. The transport system 1 can stop the mover 101 by landing the mover 101 on the work area 1707 by adjusting the stop position of the mover 101 so that each of the Y-axis positioning parts 1706 on the side of the mover 101 comes into contact with the corresponding Y-axis positioning part 1705 on the side of the stator 201. The transport system 1 according to the present embodiment can land the mover 101 in the Y direction while the transport system 1 can land the mover 101 in the Z direction in the same manner as in the first embodiment.

The assembling robot 703 of the assembling apparatus 701 performs the processing operation such as assembling the component 1704 to the workpiece 1102 attached to or held by a mover 101 transported to the work area 1707. Specifically, the assembling robot 703 assembles the component 1704 in the Y direction with respect to the workpiece 1102. In the processing operation by the assembling apparatus 701, as illustrated in FIGS. 17A and 17B, an external force 1704F is applied in the +Y direction to the workpiece 1102 and the mover 101 during the processing operation by the assembling robot 703 for assembling the component 1704 in the Y direction.

When the component 1704 is assembled in the Y direction in this way, the Y-axis positioning part 1705 on the side of the stator 201 and the Y-axis positioning part 1706 on the side of the mover 101 are in contact with each other in the present embodiment. Thus, the external force 1704F during processing can be received by the Y-axis positioning part 1705 and the Y-axis positioning part 1706. At this time, the Y-axis positioning parts 1705 and 1706 function as stoppers that limit the movable range of the mover 101 in the Y direction. Accordingly, in the present embodiment, the mover 101 can maintain a stable position with respect to the external force 1704F during the processing, and the workpiece 102 can be accurately positioned. The Y-axis positioning parts 1705 and 1706 may be configured to be movable in the -Y direction in which the external force 1704F is applied when the external force 1704F is applied.

Further, as illustrated in FIG. 17B, the Y-axis positioning part 1705 and the Y-axis positioning part 1706 which are in contact with each other constitute a supporting structure 1708 that supports the mover 101 landed in the Y direction. The support structure 1708 is constituted by arranging the Y-axis positioning part 1705 and the Y-axis positioning part 1706 in contact with each other at all or a part of a plurality of apexes of a polygon. The support structure 1708 may be composed of one or two sets of the mutually contacting Y-axis positioning parts 1705 and Y-axis positioning parts 1706. FIG. 17B illustrates the support structure 1708 composed of two sets of the mutually contacting Y-axis positioning parts 1705 and Y-axis positioning parts 1706.

In FIG. 17B, since the direction vector of the external force 1704F at the time of the processing is not positioned inside the support structure 1708 composed of the Y-axis positioning part 1705 and the Y-axis positioning part 1706, the external force 1704F at the time of processing generates a rotational force around the X-axis in the mover 101. Therefore, from the viewpoint of stabilizing the position of the mover 101, it is necessary to reduce the rotational force generated in the mover 101 around the X-axis by the external force 1704F during the processing, or to prevent the generation of such rotational force.

First, the Y-axis positioning part 1705 and the Y-axis positioning part 1706 can be provided so that the direction vector of the external force 1704F during the processing enters the inside of the support structure 1708 composed of the Y-axis positioning part 1705 and the Y-axis positioning part 1706. In this case, the generation of the rotational force around the X-axis due to the external force 1704F during the processing can be prevented.

In order to reduce the rotational force generated around the X-axis by the external force 1704F during the processing, the distance between the operating point of the external force 1704F during the processing and the support structure 1708 composed of the Y-axis positioning part 1705 and the Y-axis positioning part 1706 may be reduced. In this case, the torque component Twx about the X-axis acting on the mover 101 is sufficiently larger than the rotational force generated on the mover 101 about the X-axis by the external force 1704F during the processing. Thus, in the present embodiment, the position of the mover 101 can be stabilized regardless of the magnitude of the external force 1704F in the Y direction applied to the mover 101 during the processing of the workpiece 1102, especially even against the large external force 1704F during the processing. Further, in the present embodiment, by stabilizing the position of the mover 101, the workpiece 1102 can be positioned with high accuracy.

Furthermore, in the present embodiment as well, the Z-axis positioning part 705 on the side of the stator 201 and the Z-axis positioning part 706 on the side of the mover 101 can be brought into contact with each other at the time of processing the workpiece 1102 as in the first embodiment. Thus, the positional deviation of the mover 101 in the Z direction during processing can be also reduced or prevented.

Next, a control method of the transport system 1 for positioning the mover 101 using the Y-axis positioning part 1705 on the side of the stator 201 and the Y-axis positioning part 1706 on the side of the mover 101 will be described with reference to FIG. 18. FIG. 18 is a flowchart illustrating the control method of the transport system 1 for positioning the mover 101 according to the present embodiment. A computer functioning as the integration controller 301 can execute the control method illustrated in FIG. 18 by reading a program for executing the control method illustrated in FIG. 18 from a computer-readable storage medium and executing the program.

First, the integration controller 301 controls the floating transport of the mover 101 including the workpiece 1102 in the same manner as in the first embodiment. Thus, the integration controller 301 transports the mover 101 in the X direction while floating the mover 101 in the +Z direction to the side of the Y-axis positioning part 1705 on the side of the stator 201 in the work area 1707. Thereafter, the integration controller 301 positions the mover 101 during the processing by the assembling robot 703 of the assembling apparatus 701 in accordance with the process of the flowchart illustrated in FIG. 18.

First, the integration controller 301 executes step S200 to land the mover 101 in the Y direction. When the mover 101 lands in the Y direction, the integration controller 301 controls current command values of currents applied to each coil 202, 207, and 208 so that the Y-axis positioning part 1706 on the side of the mover 101 comes into contact with the corresponding Y-axis positioning part 1705 on the side of the stator 201.

Next, the integration controller 301 executes step S201 to stop the control of the mover 101 in the Y direction. The integration controller 301 can stop the control in the Y direction by setting Ty=0 out of the force components and the torque components (Tx, Ty, Tz, Twx, Twy, Twz) of the six axes. The integration controller 301 can set Ty=0 by controlling the current command value of the current applied to each coil 208.

Next, the integration controller 301 executes step S202 to land the mover 101 in the Z direction. When the mover 101 lands in the Z direction, the integration controller 301 controls the current command value of the current applied to each coil 202, 207, and 208 so that the Z-axis positioning part 706 on the side of the mover 101 comes into contact with the corresponding Z-axis positioning part 705 on the side of the stator 201.

Next, the integration controller 301 executes step S203 to stop the control of the mover 101 in the Z direction. The integration controller 301 can stop the control in the Z direction by setting Tz=0 out of the force components and the torque components (Tx, Ty, Tz, Twx, Twy, Twz) of the six axes. The integration controller 301 can set Tz=0 by controlling the current command value of the current applied to each coil 202. It should be noted that the integration controller 301 may omit step S203 and execute step S204 following step S202.

Next, the integration controller 301 executes step S204 to perform pressing control for pressing the mover 101 in the Z direction. In the pressing control in the Z direction, the integration controller 301 presses the mover 101 in the −Z direction in the same manner as in the first embodiment to press the Z-axis positioning part 706 on the side of the mover 101 against the Z-axis positioning part 705 on the side of the stator 201. Thus, the positional deviation of the mover 101 in the Z direction when the workpiece 1102 is processed from the Y direction can be reduced or prevented.

Next, the integration controller 301 executes step S205 to perform pressing control for pressing the mover 101 in the Y direction. In the pressing control in the Y direction, the integration controller 301 presses the mover 101 in the +Y direction by controlling the current command value of the current applied to each coil 208 to control the force component Ty in the Y direction working on the mover 101. Thus, the integration controller 301 presses the Y-axis positioning part 1706 on the side of the mover 101 to the Y-axis positioning part 1705 on the side of the stator 201. When the Y-axis positioning part 1706 is pressed against the Y-axis positioning part 1705, the static frictional force in the X direction increases between the Y-axis positioning part 1705 and the Y-axis positioning part 1706 in contact with each other. Therefore, when the workpiece 1102 is processed from the Y direction by the assembling robot 703, the movement of the mover 101 in the Y direction is restricted, and the position of the mover 101 is hardly shifted in the X direction.

Thus, the integration controller 301 makes the mover 101 land in the Y direction, which is the direction of the external force 1704F, and performs the pressing control to press the mover 101 so that the movement of the mover 101 in the Y direction is restricted by the Y-axis positioning parts 1705 and 1706. In addition, the integration controller 301 lands the mover 101 also in the Z direction and performs the pressing control to press the mover 101 so that the movement of the mover 101 in the Z direction is restricted by the Z-axis positioning parts 705 and 706.

Next, the integration controller 301 executes step S206 to generate the torque component Twx in the Wx direction as a rotational force around the X-axis so as to cancel the rotational force around the X-axis generated in the mover 101 by the pressing control in the Y direction and the Z direction. The integration controller 301 controls the torque component Twx in the Wx direction working on the mover 101 by controlling the current command value of the current applied to each coil 202. By canceling the rotational force due to the pressing control, the position of the mover 101 can be further stabilized.

As described above, the integration controller 301 performs the control for positioning the mover 101 while the assembling robot 703 processes the workpiece 1102. After the completion of the processing, the integration controller 301 can terminate the control for positioning and perform the floating transport of the mover 101 again.

Thus, in the present embodiment, after the workpiece 1102 is transported together with the mover 101, the mover 101 is positioned by using the Y-axis positioning parts 1705 and 1706 and the Z-axis positioning parts 705 and 706. Thus, the mover 101 can maintain a stable position against a large external force applied to the workpiece 1102 during the processing. Thereby, the workpiece 1102 is accurately positioned, and the workpiece 1102 is accurately processed by the process apparatus to manufacture an article.

As described above, according to the present embodiment, the position of the mover 101 can be stabilized regardless of the magnitude of the external force applied to the mover 101 during processing of the workpiece 1102.

Although the configuration in which the Y-axis positioning parts 1705 and 1706 and the Z-axis positioning parts 705 and 706 are provided has been described above, the embodiment is not limited thereto. The Z-axis positioning parts 705 and 706 may not necessarily be provided. In this case, the integration controller 301 controls the current command value of the current applied to each coil 207 to control the force component Tz or the like in the Z direction working on the mover 101, thereby positioning the mover 101 in the Z direction.

Figure 18:
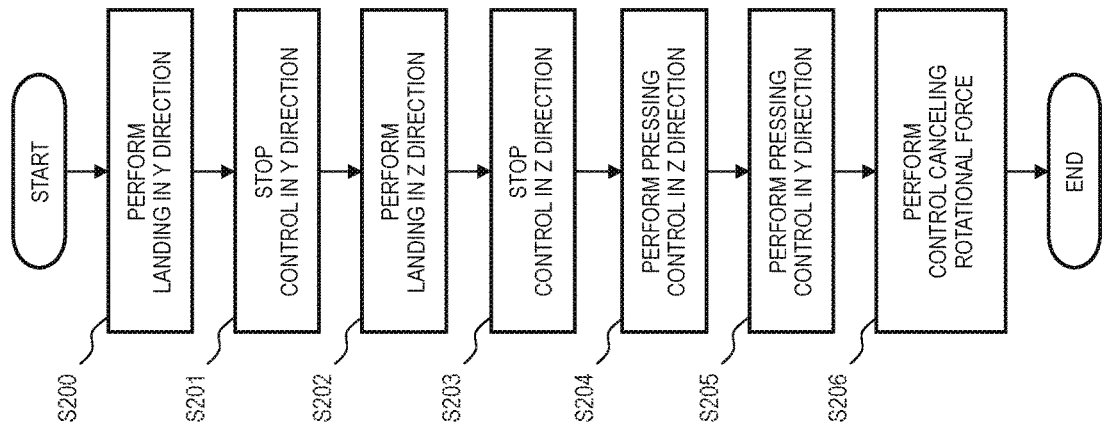
FIG. 18 is a flow chart illustrating a method of controlling the transport system according to the second embodiment of the present invention.

The order of the steps from step S200 to step S206 is not limited to the case illustrated in FIG. 18, and may be changed as appropriate. For example, step S200 and subsequent step S201, and step S202 and subsequent step S203 may be executed while switching the previous and the next steps, or may be executed in parallel. Further, for example, step S204 and S205 may be executed while switching the previous and the next steps, or may be executed in parallel.

Third Embodiment

A third embodiment of the present invention will be described with reference to FIG. 19A to FIG. 22. Note that the same components as those in the above first and second embodiments are labeled with the same references, and the description thereof will be omitted or simplified.

Figure 19A:
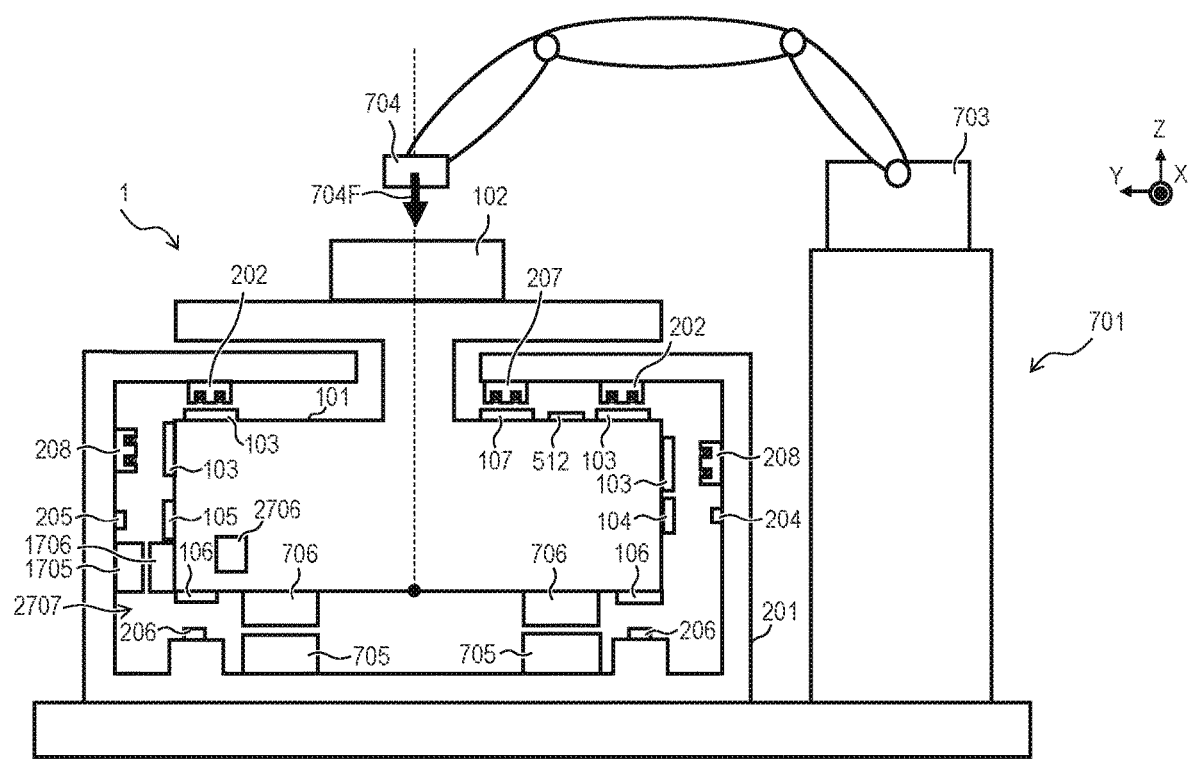
FIG. 19A is a schematic diagram illustrating a configuration of a transport system according to a third embodiment of the present invention.
Figure 19B:
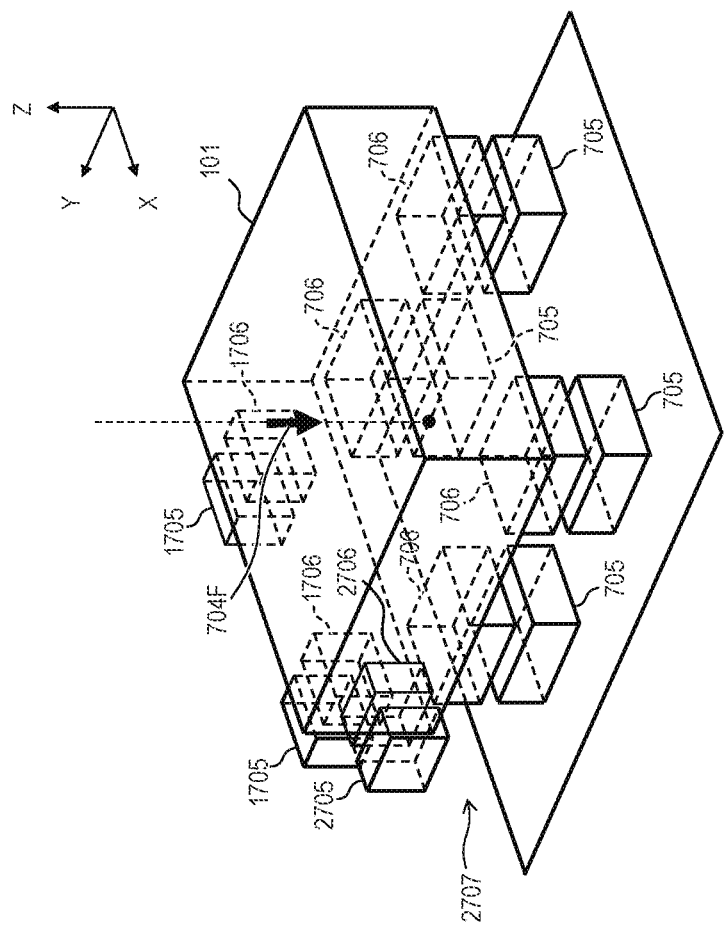
FIG. 19B is a schematic diagram illustrating the configuration of the transport system according to the third embodiment of the present invention.

First, the configuration of the transport system 1 according to the present embodiment will be described with reference to FIG. 19A and FIG. 19B. FIG. 19A and FIG. 19B are schematic views illustrating the configuration of the transport system 1 including the mover 101 and the stator 201 according to the present embodiment. Note that FIG. 19A illustrates the main parts of the mover 101 and the stator 201. FIG. 19B illustrates the mover 101, X-axis positioning parts 2705 on the side of the stator 201, and X-axis positioning parts 2706 on the side of the mover 101. FIG. 19A is a view of the mover 101 and the stator 201 viewed from the X direction, and FIG. 19B is a view of the mover 101 viewed from obliquely above.

The basic configuration of the transport system 1 according to the present embodiment is the same as that of the second embodiment. In addition to the configuration of the second embodiment, the transport system 1 according to the present embodiment includes X-axis positioning parts 2705 on the side of the stator 201 and X-axis positioning parts 2706 on the side of the mover 101 as positioning parts for positioning the mover 101 in the X direction. The X-axis positioning parts 2705 and 2706 are members that restrict the movement of the mover 101 in the X direction when the workpiece 102 is processed.

The mover 101 is configured to be transported with a workpiece 102 attached or held on or under the mover 101, for example. FIG. 19A illustrates a state in which the workpiece 102 is attached on the mover 101 to be mounted on the mover 101. The mechanism for attaching or holding the workpiece 102 on the mover 101 is not particularly limited, but a general attachment mechanism, a holding mechanism, or the like such as a mechanical hook, an electrostatic chuck, or the like, can be used.

The stator 201 has the X-axis positioning parts 2705. The X-axis positioning part 2705 has surface accuracy of a surface facing the X direction, and can be used as a positioning reference in the X direction. The X-axis positioning part 2705 is provided so as to block the transport direction (X direction) of the mover 101 when the mover 101 is positioned. Therefore, the X-axis positioning part 2705 is movable and configured to advance into the transport path, that is, the movable range in the X direction of the mover 101 when the mover 101 is positioned.

Note that the X-axis positioning part 2705 does not necessarily have to be movable, and may be fixed at a predetermined position of the transport path. In this case, the shape of the mover 101, the transporting position, and the like can be adjusted so that the mover 101 is transported while avoiding the X-axis positioning part 2705.

The mover 101 has the X-axis positioning parts 2706 corresponding to the X-axis positioning parts 2705. The X-axis positioning part 2706 has surface accuracy of a surface facing the X direction, and can be used as a positioning reference in the X direction.

In the stator 201, the X-axis positioning parts 2705 are installed so as to be able to advance into an area where the mover 101 lands. The area where the mover 101 lands is a work area 2707 where the assembling apparatus 701 assembles a component 704 to the workpiece 102 on the mover 101. The X-axis positioning part 2705 is a columnar member having a side face parallel to the YZ plane facing the −X direction. The Z-axis positioning parts 705 and the Y-axis positioning parts 1705 are provided on the floor surface and the side surface of the work area 2707, respectively, as in the second embodiment. Note that the Z-axis positioning parts 705 and the Y-axis positioning parts 1705 do not necessarily have to be installed.

In the mover 101, the X-axis positioning parts 2706 are installed on a side face facing the advancing direction of the mover 101. The X-axis positioning part 2706 is a columnar member having a side face parallel to the YZ plane facing the +X direction. The X-axis positioning part 2706 is provided at a position capable of opposing the corresponding X-axis positioning part 2705. The Z-axis positioning parts 706 and the Y-axis positioning parts 1706 are provided on the lower surface and the side surface of the mover 101, as in the second embodiment. Note that the Z-axis positioning parts 706 and the Y-axis positioning parts 1706 do not necessarily have to be installed.

As will be described later, the mover 101, which is floated in the +Z direction and transported in the X direction, lands in the X direction so that the side surface of the X-axis positioning part 2706 contacts the side surface of the corresponding X-axis positioning part 2705 in the work area 2707. The landing mover 101 can be floated again and transported.

The mover 101 and the stator 201 are provided with a process apparatus for performing a processing operation on the workpiece 102 transported by the mover 101. FIG. 19A illustrates a case where the mover 101 and the stator 201 are incorporated in the assembling apparatus 701, which is an example of a process apparatus for performing a processing operation on the workpiece 102.

The assembling apparatus 701 has the same configuration as that of the first embodiment including the assembling robot 703. The assembling robot 703 assembles the component 704 from the Z direction to the workpiece 102 mounted on the upper part of the mover 101 transported to the work area 2707 in front of the installation place of the assembling robot 703.

The transport system 1 according to the present embodiment can transport the mover 101 to the work area 2707 of the assembling apparatus 701 while controlling the attitude of the mover 101 in the same manner as in the first embodiment, and can land the mover 101 in the X direction in the work area 2707 and stop the mover 101. The transport system 1 can stop the mover 101 by landing the mover 101 on the work area 2707 by adjusting the stop position of the mover 101 so that the X-axis positioning part 2706 on the side of the mover 101 comes into contact with the corresponding X-axis positioning part 2705 on the side of the stator 201. In the transport system 1 according to the present embodiment, the mover 101 can land in the X direction while the mover 101 can land in the Y and Z directions in the same manner as in the second embodiment.

The assembling robot 703 of the assembling apparatus 701 assembles the component 1704 in the Z direction with respect to the workpiece 102 attached to or held by the mover 101 transported to the work area 2707 in the same manner as in the first embodiment. As illustrated in FIG. 19A and FIG. 19B, the external force 704F is applied to the workpiece 102 and the mover 101 in the −Z direction during the processing by the assembling apparatus 701, as in the first embodiment.

When the component 704 is assembled in the Z direction in this way, the Z-axis positioning part 705 on the side of the stator 201 and the Z-axis positioning part 706 on the side of the mover 101 are in contact with each other in the present embodiment as in the first embodiment. Thus, the external force during the processing can be received by the Z-axis positioning part 705 and the Z-axis positioning part 706. Accordingly, even in the present embodiment, the mover 101 can maintain a stable position with respect to the large external force 704F during the processing, and the workpiece 102 can be accurately positioned.

Also in the present embodiment, when the component 704 is assembled, the Y-axis positioning part 1705 on the side of the stator 201 can be brought into contact with the Y-axis positioning part 1706 on the side of the mover 101 as in the second embodiment. Thus, the positional deviation of the mover 101 in the Y direction, which occurs during the processing, can be reduced or prevented.

Further, in the present embodiment, when the component 704 is assembled, the X-axis positioning part 2705 on the side of the stator 201 is in contact with the X-axis positioning part 2706 on the side of the mover 101. At this time, the X-axis positioning parts 2705 and 2706 function as stoppers that limit the movable range of the mover 101 in the X direction. Thus, it is possible to reduce or prevent the positional deviation of the mover 101 in the X direction that occurs during the processing. The X-axis positioning parts 2705 and 2706 may be movable in the +X direction, which is the advancing direction of the mover 101, and in the −X direction, which is the retreating direction.

Note that, as illustrated in FIG. 20A to FIG. 21B, the X-axis positioning part 2706 on the side of the mover 101 and the X-axis positioning part 2705 on the side of the stator 201 may have different configurations from those illustrated in FIG. 19A and FIG. 19B.

Figure 20A:
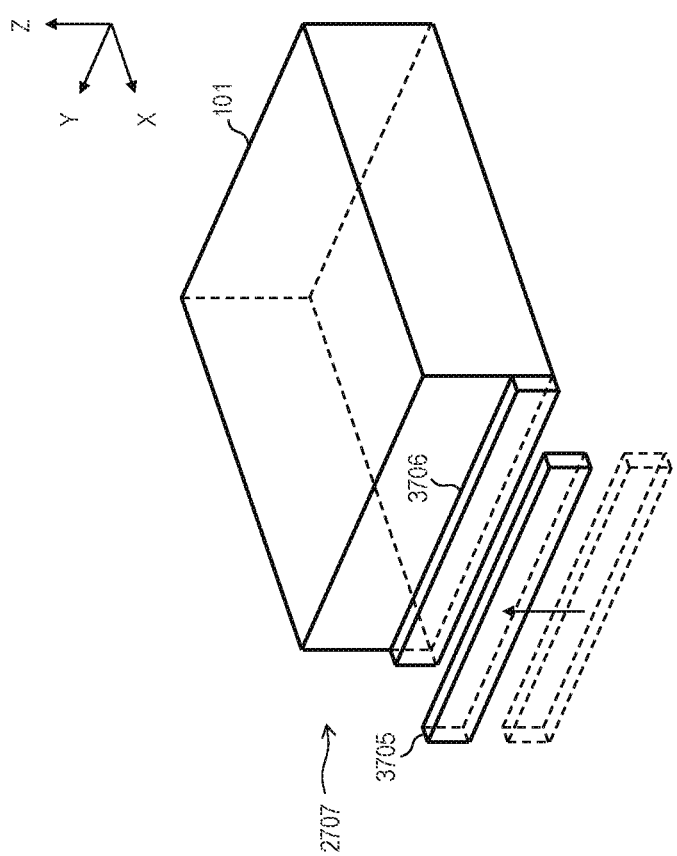
FIG. 20A is a schematic diagram illustrating another configuration of the transport system according to the third embodiment of the present invention.

FIG. 20A illustrates an X-axis positioning part 3706 on the side of the mover 101 as another configuration of the X-axis positioning part 2706 on the side of the mover 101, and illustrates an X-axis positioning part 3705 on the side of the stator 201 as another configuration of the X-axis positioning part 2705 on the side of the stator 201.

As illustrated in FIG. 20A, the X-axis positioning part 3705 on the side of the stator 201 is movable, moves in the +Z direction when positioning is required, and is used for positioning the mover 101. In the positioning, the mover 101 moves in the +X direction. Thus, the X-axis positioning part 3706 on the side of the mover 101 and the X-axis positioning part 3705 on the side of the stator 201 moved in the +Z direction come into contact with each other to realize the positioning. In FIG. 20A, when the processing to the workpiece 102 is completed and the floating transport of the mover 101 is performed again, the X-axis positioning part 3705 on the side of the stator 201 moves in the −Z direction to secure the transport path of the mover 101. As described above, the X-axis positioning part 3705 is configured to be movable so as to secure the transport path of the mover 101.

Figure 20B:
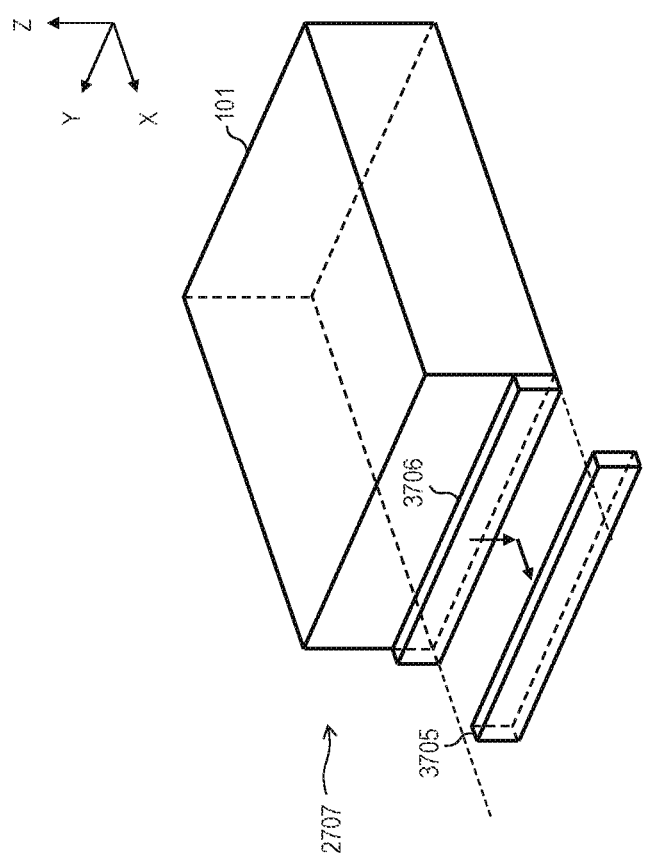
FIG. 20B is a schematic diagram illustrating another configuration of the transport system according to the third embodiment of the present invention.

On the other hand, FIG. 20B illustrates a case in which the X-axis positioning part 3705 on the side of the stator 201 and the X-axis positioning part 3706 on the side of the mover 101 operate differently from the case illustrated in FIG. 20A. That is, in FIG. 20B, while the X-axis positioning part 3705 on the side of the stator 201 is fixed, in positioning, the mover 101 descends in the −Z direction and moves in the +X direction. Thus, the X-axis positioning part 3706 on the side of the mover 101 and the X-axis positioning part 3705 on the side of the stator 201 come into contact with each other to realize the positioning. In FIG. 20B, when the processing to the workpiece 102 is completed and the mover 101 is floated and transported again, the mover 101 floats in the +Z direction to a height not interfering with the X-axis positioning part 3705 on the side of the stator 201 to secure the transport path of the mover 101.

Figure 21A:
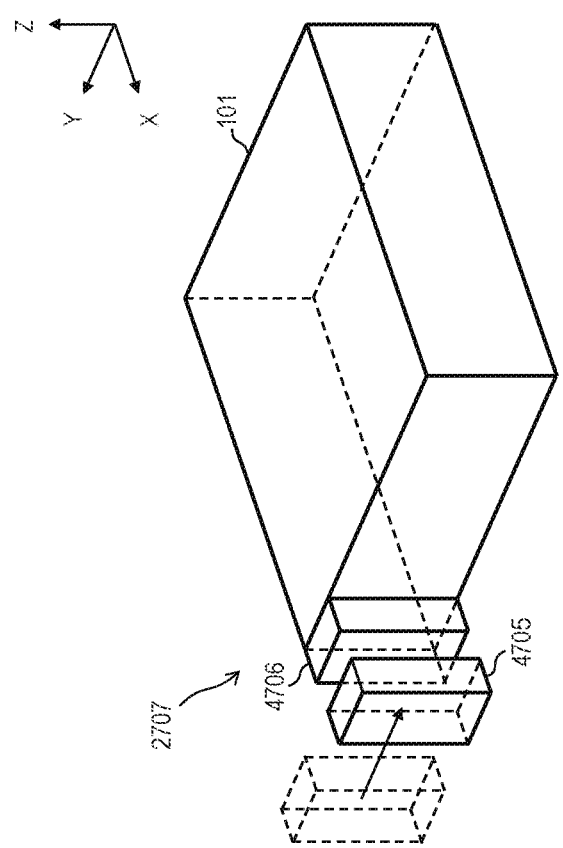
FIG. 21A is a schematic diagram illustrating another configuration of the transport system according to the third embodiment of the present invention.

FIG. 21A illustrates an X-axis positioning part 4706 on the side of the mover 101 as another configuration of the X-axis positioning part 2706 on the side of the mover 101, and illustrates an X-axis positioning part 4705 on the side of the stator 201 as another configuration of the X-axis positioning part 2705 on the side of the stator 201.

As illustrated in FIG. 21A, the X-axis positioning part 4705 on the side of the stator 201 is movable, and moves in the −Y direction to be used for positioning the mover 101 when positioning is required. In positioning, the mover 101 moves in the +X direction. Thus, the X-axis positioning part 4706 on the side of the mover 101 and the X-axis positioning part 4705 on the side of the stator 201 moved in the −Y direction come into contact with each other to realize the positioning. In FIG. 21A, when the processing to the workpiece 102 is completed and the mover 101 is floated and transported again, the X-axis positioning part 4705 on the side of the stator 201 moves in the +Y direction to secure the transport path of the mover 101. As described above, the X-axis positioning part 4705 is configured to be movable so as to secure the transport path of the mover 101.

On the other hand, FIG. 21B illustrates a case in which the X-axis positioning part 4705 on the side of the stator 201 and the X-axis positioning part 4706 on the side of the mover 101 operate differently from the case illustrated in FIG. 21A. That is, in FIG. 20B, while the X-axis positioning part 4705 on the side of the stator 201 is fixed, in positioning, the mover 101 moves in the +Y direction and moves in the +X direction. Thus, the X-axis positioning part 4706 on the side of the mover 101 and the X-axis positioning part 4705 on the side of the stator 201 come into contact with each other to realize the positioning. In FIG. 21B, when the processing to the workpiece 102 is completed and the floating transport of the mover 101 is performed again, the mover 101 moves in the −Y direction so as not to interfere with the X-axis positioning part 4705 on the side of the stator 201 to secure the transport path of the mover 101.

Figure 22:
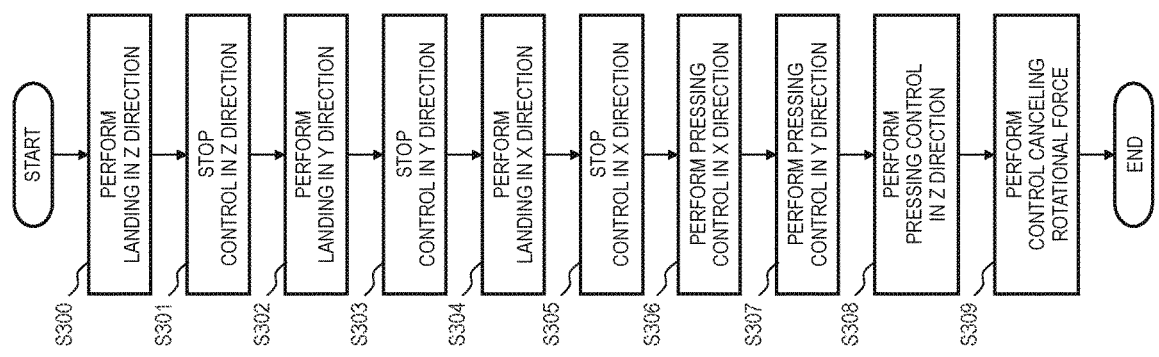
FIG. 22 is a flow chart illustrating a method of controlling the transport system according to the third embodiment of the present invention.

Next, a control method of the transport system 1 for positioning the mover 101 using the X-axis positioning part 2705 on the side of the stator 201 and the X-axis positioning part 2706 on the side of the mover 101 will be described with reference to FIG. 22. FIG. 22 is a flowchart illustrating the control method of the transport system 1 for positioning the mover 101 according to the present embodiment. A computer functioning as the integration controller 301 can execute the control method illustrated in FIG. 22 by reading a program for executing the control method illustrated in FIG. 22 from a computer-readable storage medium and executing the program.

First, the integration controller 301 controls the floating transport of the mover 101 including the workpiece 102 in the same manner as in the first embodiment. Thus, the integration controller 301 transports the mover in the X direction while floating the mover 101 in the +Z direction to the upper side of the Z-axis positioning part 705 on the side of the stator 201 in the work area 2707. Thereafter, the integration controller 301 positions the mover 101 during the processing by the assembling robot 703 of the assembling apparatus 701 in accordance with the processing in the flowchart illustrated in FIG. 22.

First, the integration controller 301 executes step S300 to land the mover 101 in the Z direction, which is the processing axis direction of the processing by the assembling robot 703. When the mover 101 lands in the Z direction, the integration controller 301 controls current command values of currents applied to each coil 202, 207, and 208 so that the Z-axis positioning part 706 on the side of the mover 101 comes into contact with the corresponding Z-axis positioning part 705 on the side of the stator 201.

Next, the integration controller 301 executes step S301 to stop the control of the mover 101 in the Z direction. The integration controller 301 can stop the control in the Z direction by setting Tz=0 out of the force components and the torque components (Tx, Ty, Tz, Twx, Twy, Twz) of the six axes. The integration controller 301 can set Tz=0 by controlling the current command value of the current applied to each coil 202.

Next, the integration controller 301 executes step S302 to land the mover 101 in the Y direction. When the mover 101 lands in the Y direction, the integration controller 301 controls the current command value of the current applied to each coil 202, 207, and 208 so that the Y-axis positioning part 1706 on the side of the mover 101 comes into contact with the corresponding Y-axis positioning part 1705 on the side of the stator 201.

Next, the integration controller 301 executes step S303 to stop the control of the mover 101 in the Y direction. The integration controller 301 can stop the control in the Y direction by setting Ty=0 out of the force components and the torque components (Tx, Ty, Tz, Twx, Twy, Twz) of the six axes. The integration controller 301 can set Ty=0 by controlling the current command value of the current applied to each coil 208.

Next, the integration controller 301 executes step S304 to land the mover 101 in the X direction. When the mover 101 lands in the X direction, the integration controller 301 controls the current command value of the current applied to each coil 202, 207, and 208 so that the X-axis positioning part 2706 on the side of the mover 101 comes into contact with the corresponding X-axis positioning part 2705 on the side of the stator 201.

Next, the integration controller 301 executes step S305 to stop the control of the mover 101 in the X direction. The integration controller 301 can stop the control in the X direction by setting Tx=0 out of the force components and the torque components (Tx, Ty, Tz, Twx, Twy, Twz) of the six axes. The integration controller 301 can set Tx=0 by controlling the current command value of the current applied to each coil 207. It should be noted that the integration controller 301 may omit step S305 and execute step S306 following step S304.

Next, the integration controller 301 executes step S306 to perform pressing control for pressing the mover 101 in the X direction. In the pressing control in the X direction, the integration controller 301 presses the mover 101 in the +X direction by controlling the current command value of the current applied to each coil 207 to control the force component Tx in the X direction working on the mover 101. Thus, the integration controller 301 presses the X-axis positioning part 2706 on the side of the mover 101 to the X-axis positioning part 2705 on the side of the stator 201. Thus, when the workpiece 102 is processed from the Z direction by the assembling robot 703, the positional deviation of the mover 101 in the X direction can be reduced or prevented.

Next, the integration controller 301 executes step S307 to perform pressing control for pressing the mover 101 in the Y direction. In the pressing control in the Y direction, the integration controller 301 presses the mover 101 in the +Y direction by controlling the current command value of the current applied to each coil 208 to control the force component Ty in the Y direction working on the mover 101. Thus, the integration controller 301 presses the Y-axis positioning part 1706 on the side of the mover 101 to the Y-axis positioning part 1705 on the side of the stator 201. Thus, when the workpiece 102 is processed from the Z direction by the assembling robot 703, the positional deviation of the mover 101 in the Y direction can be reduced or prevented.

Next, the integration controller 301 executes step S308 to perform pressing control for pressing the mover 101 in the Z direction. In the pressing control in the Z direction, the integration controller 301 presses the mover 101 in the −Z direction by controlling the current command value of the current applied to each coil 202 to control the force component Tz in the Z direction working on the mover 101. Thus, the integration controller 301 presses the Z-axis positioning part 706 on the side of the mover 101 to the Z-axis positioning part 705 on the side of the stator 201. Thus, when the workpiece 102 is processed from the Z direction by the assembling robot 703, the positional deviation of the mover 101 in the Z direction can be reduced or prevented.

Next, the integration controller 301 executes step S309 to generate a rotational force around the Y-axis or the Z-axis so as to cancel the rotational force around the Y-axis or the Z-axis generated in the mover 101 by the pressing control in the X direction. That is, the integration controller 301 generates the torque component Twy in the Wy direction and the torque component Twz in the Wz direction as rotational forces around the Y-axis and the Z-axis. The integration controller 301 controls the torque component Twy in the Wy direction working on the mover 101 by controlling the current command value of the current applied to each coil 202. The integration controller 301 controls the torque component Twz in the Wz direction working on the mover 101 by controlling the current command value of the current applied to each coil 208. By canceling the rotational forces due to the pressing control, the position of the mover 101 can be further stabilized.

As described above, the integration controller 301 performs the control for positioning the mover 101 while the assembling robot 703 processes the workpiece 102. After the completion of the processing, the integration controller 301 can terminate the control for positioning and perform the floating transport of the mover 101 again.

Thus, in the present embodiment, after the workpiece 102 is transported together with the mover 101, the mover 101 is positioned using the X-axis positioning parts 2705 and 2706, the Y-axis positioning parts 1705 and 1706, and the Z-axis positioning parts 705 and 706. Thus, the mover 101 can maintain a stable position against a large external force applied to the workpiece 102 during the processing. Thereby, the workpiece 102 is accurately positioned, and the workpiece 102 is accurately processed by the process apparatus to manufacture an article.

As described above, according to the present embodiment, the position of the mover 101 can be stabilized regardless of the magnitude of the external force applied to the mover 101 during the processing of the workpiece 102.

Although the configuration in which the X-axis positioning parts 2705 and 2706, the Y-axis positioning parts 1705 and 1706, and the Z-axis positioning parts 705 and 706 are provided has been described above, the embodiment is not limited thereto. The Y-axis positioning parts 1705 and 1706 may not necessarily be provided. In this case, the integration controller 301 controls the current command value of a current applied to each coil 208 to control the force component Ty or the like in the Y direction working on the mover 101, thereby positioning the mover 101 in the Y direction. Also, the Z-axis positioning parts 705 and 706 may not necessarily be provided. In this case, the integration controller 301 controls the current command value of the current applied to each coil 207 to control the force component Tz or the like in the Z direction working on the mover 101, thereby positioning the mover 101 in the Z direction.

Modified Embodiment

The present invention is not limited to the embodiments described above, and various modifications are possible.

In the above embodiment, the case where the X-axis positioning part 2705 of the stator 201 is movable has been described as an example, but the present invention is not limited thereto. At least one of the Z-axis positioning part 705 and the Y-axis positioning part 1705 of the stator 201 can be made movable.

In the above embodiment, the case where a plurality of coils 202, 207, and 208 are arranged in a predetermined number of lines has been described as an example, but the present invention is not limited thereto. Each coil can be arranged in a prescribed number of lines according to the yoke plate 103 and the conductive plate 107 arranged on the mover 101.

In the above embodiment, the case where the mover 101 is provided with the yoke plate 103 and the conductive plate 107 has been described as an example, but the present invention is not limited thereto. The mover 101 may have a magnet group including a plurality of permanent magnets instead of the yoke plate 103 and the conductive plate 107. The magnet group may include, for example, a plurality of permanent magnets arranged along the X direction.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

According to the present invention, in the floating type transport system, the position of the mover can be stabilized regardless of the magnitude of the external force applied to the mover during the processing of the workpiece.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2021-096207, filed Jun. 8, 2021, and No. 2022-060217, filed Mar. 31, 2022, which are hereby incorporated by reference herein in their entirety.

What is claimed is:
1. A transport system comprising:
a mover on which a workpiece is mounted and which is movable in a first direction;
a stator that has a plurality of coils arranged in the first direction and applied force to the mover by using the plurality of coils to which current is applied, the force transporting the mover in the first direction while floating the mover in a second direction crossing the first direction;
a control unit that acquires a position and an attitude of the mover moving in the first direction while floating in the second direction and controls the current applied to the plurality of coils to control operation of the mover based on the acquired position and the acquired attitude; and
a positioning part that limits the movement of the mover, wherein the positioning part includes a first positioning part that limits the movement of the mover in a direction of external force applied to the workpiece, wherein the control unit lands the mover in the direction of the external force and performs pressing control to press the mover so that the movement of the mover is limited by the first positioning part, wherein the control unit performs control to generate rotational force that cancels rotational force working on the mover by the pressing control.

2. The transport system according to claim 1, wherein the direction of the external force is the second direction or a third direction crossing the first direction and the second direction.

3. The transport system according to claim 1, wherein the positioning part is a stopper that limits a movable range of the mover.

4. The transport system according to claim 1, wherein the positioning part includes a second positioning part that limits the movement of the mover in a direction crossing the first direction and the direction of the external force.

5. The transport system according to claim 4, wherein the control unit lands the mover in the direction crossing the direction of the external force and the first direction and performs pressing control to press the mover so that the movement of the mover is limited by the second positioning part.

6. The transport system according to claim 1, wherein the positioning part includes a third positioning part that limits the movement of the mover in the first direction.

7. The transport system according to claim 6, wherein the control unit lands the mover in the first direction and performs pressing control to press the mover so that the movement of the mover is limited by the third positioning part.

8. The transport system according to claim 1, wherein the positioning part is configured to be movable so as to secure a transport path of the mover.

9. The transport system according to claim 3, wherein the positioning part is provided in the movable range.

10. A processing system comprising:

the transport system according to claim 1; and a process apparatus that performs processing on the workpiece transported by the mover.

11. An article manufacturing method for manufacturing an article by using the processing system according to claim 10, the article manufacturing method comprising steps of:

transporting the workpiece by using the mover; and performing, by using the process apparatus, the processing on the workpiece transported by the mover.

12. A control method of a transport system, the transport system comprising:

a mover on which a workpiece is mounted and which is movable in a first direction;

a stator that has a plurality of coils arranged in the first direction and applies force to the mover by using the plurality of coils to which current is applied, the force transporting the mover in the first direction while floating the mover in a second direction crossing the first direction; and a positioning part that limits the movement of the mover, wherein the positioning part includes a first positioning part that limits the movement of the mover in a direction of external force applied to the mover during the processing of the workpiece, the control method comprising:

acquiring a position and an attitude of the mover moving in the first direction while floating in the second direction and controlling the current applied to the plurality of coils to control operation of the mover based on the acquired position and the acquired attitude; and landing the mover in the direction of the external force and performing pressing control to press the mover so that the movement of the mover is limited by the first positioning part.

13. The control method according to claim 12, wherein the positioning part includes a second positioning part that limits the movement of the mover in a direction crossing the direction of the external force and the first direction, and wherein the control method comprises landing the mover in the direction crossing the direction of the external force and the first direction and performing pressing control to press the mover so that the movement of the mover is limited by the second positioning part.

14. The control method according to claim 12, wherein the positioning part includes a third positioning part that limits the movement of the mover in the first direction, and wherein the control method comprise landing the mover in the first direction and performing pressing control to press the mover so that the movement of the mover is limited by the third positioning part.

15. The control method according to claim 12, wherein the control method comprises performing control to generate rotational force that cancels rotational force working on the mover by the pressing control.

16. A non-transitory computer-readable storage medium storing a program that causes a computer to execute the control method according to claim 12.

* * * * *